United States Patent
Senokuchi et al.

(10) Patent No.: US 9,651,806 B2
(45) Date of Patent: May 16, 2017

(54) DISPLAY PANEL

(71) Applicant: Sharp Kabushiki Kaisha, Osaka-shi, Osaka (JP)

(72) Inventors: Yuta Senokuchi, Osaka (JP); Noriyuki Ohashi, Osaka (JP); Shohichi Andoh, Osaka (JP); Tomoyuki Nagai, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 90 days.

(21) Appl. No.: 14/416,691

(22) PCT Filed: Aug. 2, 2013

(86) PCT No.: PCT/JP2013/004705
§ 371 (c)(1),
(2) Date: Jan. 23, 2015

(87) PCT Pub. No.: WO2014/024455
PCT Pub. Date: Feb. 13, 2014

(65) Prior Publication Data
US 2015/0185539 A1    Jul. 2, 2015

(30) Foreign Application Priority Data
Aug. 10, 2012  (JP) ................. 2012-178353

(51) Int. Cl.
*G02F 1/1339*    (2006.01)
*G02F 1/1333*    (2006.01)
(Continued)

(52) U.S. Cl.
CPC ...... *G02F 1/133308* (2013.01); *G02F 1/1339* (2013.01); *G02F 1/133345* (2013.01);
(Continued)

(58) Field of Classification Search
CPC ...... G02F 1/1339; G02F 1/161; G02F 1/0107; G02F 1/133345; G02F 1/1345; G02F 1/13452

See application file for complete search history.

(56) References Cited

U.S. PATENT DOCUMENTS

| | | | |
|---|---|---|---|
| 6,317,186 B1 | 11/2001 | Miwa et al. | |
| 7,088,417 B2 * | 8/2006 | Kamijima | G02F 1/1339 349/149 |

(Continued)

FOREIGN PATENT DOCUMENTS

| | | |
|---|---|---|
| JP | 63-109413 A | 5/1988 |
| JP | 09-43616 A | 2/1997 |
| JP | 2000-193989 A | 7/2000 |
| JP | 2002-40442 A | 2/2002 |
| JP | 2003-005195 A | 1/2003 |

(Continued)

OTHER PUBLICATIONS

Official Communication issued in International Patent Application No. PCT/JP2013/004705, mailed on Oct. 29, 2013.

*Primary Examiner* — Kendrick Hsu
(74) *Attorney, Agent, or Firm* — Keating & Bennett, LLP

(57) ABSTRACT

A liquid crystal display panel (1) includes a TFT substrate (10), a CF substrate (20) facing the TFT substrate (10), a frame region around a display region (D), and a sealing material (26) in the frame region. The frame region includes a wide frame region ($F_1$) adjacent to a terminal region (T), and a narrow frame region ($F_2$) having a smaller width than the wide frame region ($F_1$). A dummy structure (2) overlapping the sealing material (26) as viewed from above is in the CF substrate (20) in the wide frame region ($F_1$).

6 Claims, 33 Drawing Sheets

(51) Int. Cl.
    *H05B 33/04*     (2006.01)
    *H05B 33/10*     (2006.01)
    *G02F 1/1335*     (2006.01)
    *H01L 51/52*     (2006.01)
    *H01L 27/32*     (2006.01)

(52) U.S. Cl.
    CPC ...... *G02F 1/133512* (2013.01); *H01L 51/524* (2013.01); *H01L 51/5246* (2013.01); *H01L 51/5284* (2013.01); *H05B 33/04* (2013.01); *H05B 33/10* (2013.01); *G02F 1/13394* (2013.01); *G02F 1/133351* (2013.01); *G02F 2001/133357* (2013.01); *G02F 2001/133388* (2013.01); *G02F 2202/28* (2013.01); *H01L 27/322* (2013.01)

(56) References Cited

U.S. PATENT DOCUMENTS

| | | | |
|---|---|---|---|
| 2002/0063839 A1 | 5/2002 | Matsumoto | |
| 2006/0170854 A1* | 8/2006 | Han | G02F 1/1339 349/153 |
| 2008/0123032 A1* | 5/2008 | Taniguchi | G02F 1/133555 349/113 |

FOREIGN PATENT DOCUMENTS

| | | |
|---|---|---|
| JP | 2006-349974 A | 12/2006 |
| JP | 2007-171363 A | 7/2007 |
| JP | 2008-151969 A | 7/2008 |
| JP | 2008-158169 A | 7/2008 |

\* cited by examiner

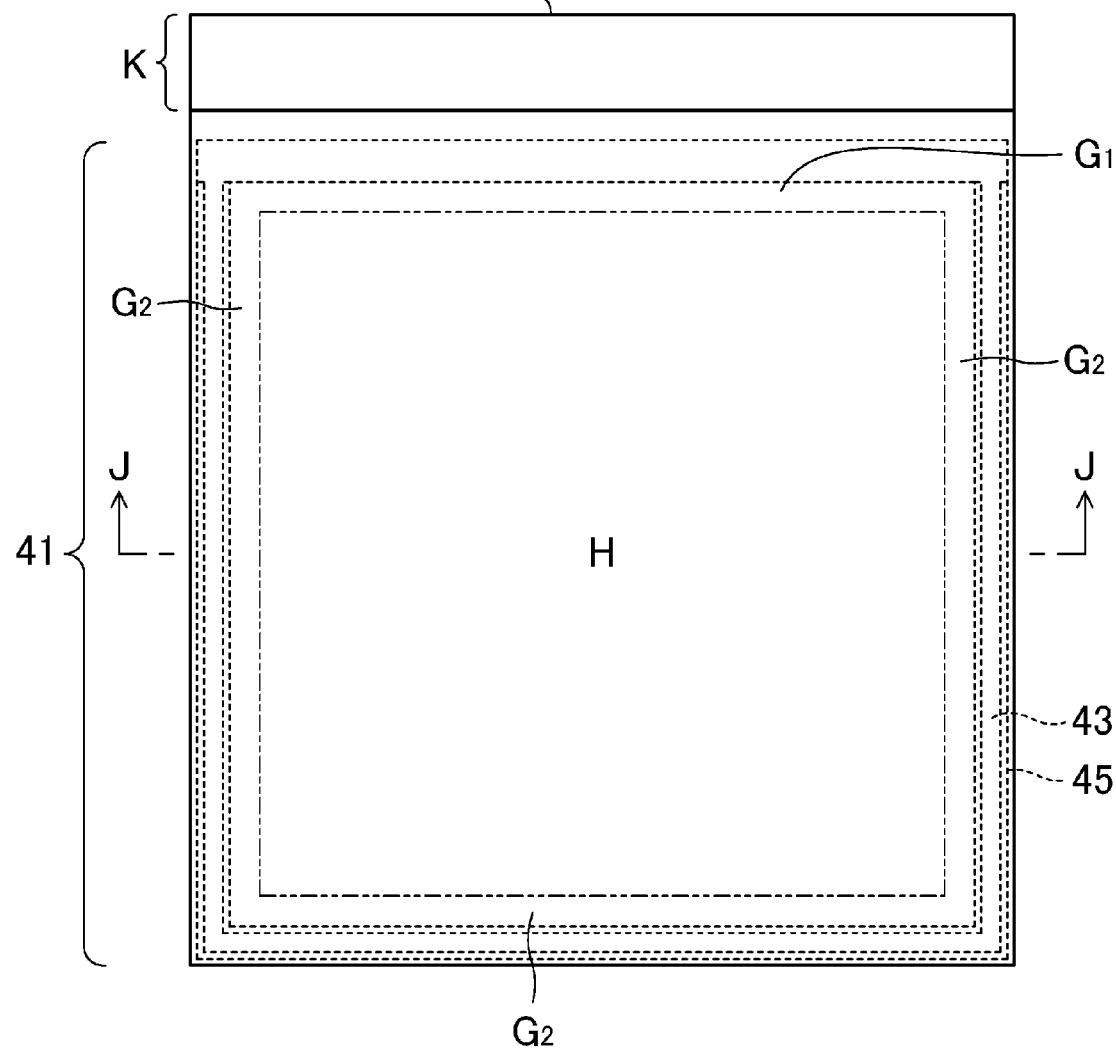

DISPLAY PANEL

TECHNICAL FIELD

The present invention relates to a display panel such as a liquid crystal display panel formed by allowing a pair of substrates to overlap each other with a predetermined distance, and encapsulating liquid crystal between the pair of substrates.

BACKGROUND ART

In recent years, with rapid development in mobile electronics such as notebook computers or mobile phones including display panels such as liquid crystal display panels, there is an increasing demand for reducing the thicknesses and the sizes of the display panels.

In general, each liquid crystal display panel includes a pair of facing substrates (i.e., a thin film transistor (TFT) substrate and a color filter (CF) substrate), a liquid crystal layer between the pair of substrates, and a sealing material provided in a frame shape to allow the pair of substrates to adhere to each other, and to encapsulate liquid crystal between the substrate.

Such liquid crystal display panels are utilized for mobile devices such as mobile phones, mobile information terminal equipment, and portable game players. In such a mobile device, there is a very strong need for expanding a pixel region in a liquid crystal display panel in view of improving the portability and reducing the size and the thickness of the display panel. It is thus necessary to reduce the external portion (i.e., the frame region) of a display region in the liquid crystal display panel as much as possible to expand the pixel region in the liquid crystal display panel. In other word, the liquid crystal display panel needs to have a narrower frame. It is however, necessary to reduce the width of the sealing material located in the frame region to obtain the narrower frame. With a decrease in the width of the sealing material, the bonding area of the sealing material decreases, thereby reducing the adhesive strength and the bulk strength of the sealing material.

It is generally most efficient to form a sealing material with a constant width to surround a display region. Thus, the sealing material in a wide frame region adjacent to a terminal region is formed to have a same width as the sealing material in a narrow frame region.

For example, a liquid crystal display panel has been suggested (see, e.g., PATENT DOCUMENT 1), which includes a terminal region, a display region, and a frame region. The terminal region includes a plurality of terminals receiving signals from the outside. The display region displays images. The frame region is provided around the display region. The sealing material is formed in a frame shape to surround the display region. The sealing material has a constant height in a wide frame region adjacent to a terminal region and in a narrow frame region.

Another liquid crystal display panel has been suggested (see, e.g., PATENT DOCUMENT 2), which is formed by linearly applying a sealing material with a constant width onto the surface of one of a TFT substrate or a CF substrate to surround a display region.

CITATION LIST

Patent Document

PATENT DOCUMENT 1: Japanese Unexamined Patent Publication No. S63-109413

PATENT DOCUMENT 2: Japanese Unexamined Patent Publication No. 2006-349974

SUMMARY OF THE INVENTION

Technical Problem

Assume that the sealing material in the wide frame region is formed to have the same width as the sealing material in the narrow frame region as in the display panels described in the PATENT DOCUMENTS 1 and 2. In a display panel including a narrow frame region, the width of a sealing material in a wide frame region is restricted by the width of the sealing material in the narrow frame region, and the sealing material is formed in the wide frame region to have the same width as in the narrow frame region. Thus, the adhesive strength of the sealing material is the same in the wide frame region and in the narrow frame region. However, being adjacent to a terminal region, the wide frame region needs to have higher adhesive strength than the narrow frame region.

In addition, where the sealing material is formed in the narrow frame region to have the same width as in the wide frame region, the sealing material has a great width in the narrow frame region. This results in difficulty in narrowing a narrower frame.

The present invention was made in view of the above-described problems. The present invention provides a display panel, which prevents reduction in the adhesive strength of a sealing material to while narrowing the frame.

Solution to the Problem

To achieve the objective, a display panel according to an aspect of the present invention includes a first substrate; a second substrate facing the first substrate; a display element between the first substrate and the second substrate; a terminal region along one side of the first substrate; a display region including the display element and configured to display an image; a frame region around the display region, the frame region including a first frame region adjacent to the terminal region, and a second frame region having a smaller width than the first frame region; and a sealing material in the frame region between the first substrate and the second substrate, the sealing material configured to allow the first substrate to adhere to the second substrate. A dummy structure overlapping the sealing material as viewed from above is provided in at least one of the first substrate or the second substrate in the first frame region.

With this feature, the sealing material is interposed between the first substrate and the second substrate, and then pressure is applied. This sealing material allows the first substrate to adhere to the second substrate, that is, the first substrate and the second substrate are bonded together via the sealing material. At this time, since the sealing material in the first frame region is compressed by the dummy structure, the sealing material has a greater width (i.e., thickness) in the first frame region.

The sealing material has a most suitable width in the second frame region when being formed. In other words, the sealing material is formed with a width sufficient to reliably provide the adhesive strength. In the first frame region, the sealing material is formed with the great width without being restricted by the width of the sealing material in the second frame region. As a result, a narrow-frame display panel is obtained, which controls the finished width of the sealing material, and reliably provides most suitable adhesive strength in both the first and second frame regions.

In the display panel according to the aspect of the present invention, the dummy structure may be provided in the first substrate in the first frame region. The sealing material may cover the dummy structure.

In the display panel according to the aspect of the present invention, the first substrate may include a first insulating substrate, and a first planarization film on the first insulating substrate. A through groove may be formed in the dummy structure. The dummy structure may be provided in the first frame region on a surface of the first planarization film. The sealing material may be in contact with the first planarization film via the through groove.

This feature increases the contact area between the sealing material covering the dummy structure and the first planarization film, thereby preventing the dummy structure on the first planarization film from peeling off the first planarization film.

In the display panel according to the aspect of the present invention, the first substrate may include a photo spacer on the first planarization film. The dummy structure may be made of a same material as the photo spacer.

With this feature, the dummy structure can be formed at the same time as the photo spacer. The dummy structure is therefore provided without increasing the manufacturing steps.

In the display panel according to the aspect of the present invention, the dummy structure may be provided in the second substrate in the first frame region. The second substrate may include a second planarization film in the first frame region between the sealing material and the dummy structure. The second planarization film covers the dummy structure.

With this feature, when the first substrate and the second substrate are bonded together, the sealing material in the first frame region is compressed by the dummy structure and the second planarization film. This further increases the width of the sealing material in the first frame region.

In the display panel according to the aspect of the present invention, the second substrate may include a second insulating substrate, and a black matrix on the second insulating substrate. A through groove may be formed in the dummy structure. The dummy structure may be provided in the first frame region on a surface of the black matrix. The second planarization film may cover the dummy structure and the black matrix. The second planarization film may be in contact with the black matrix via the through groove.

This feature increases the contact area between the second planarization film covering the dummy structure and the black matrix, thereby preventing the dummy structure on the black matrix from peeling off the black matrix.

In the display panel according to the present invention, the second substrate may include a color layer on the second insulating substrate. The dummy structure may be made of a same material as the color layer.

With this feature, the dummy structure can be formed at the same time as the color layer. The dummy structure is therefore provided without increasing the manufacturing steps.

A display panel according to another aspect of the present invention includes a first substrate; a second substrate facing the first substrate; a display element between the first substrate and the second substrate; a terminal region along one side of the first substrate; a display region including the display element and configured to display an image; a frame region around the display region, the frame region including a first frame region adjacent to the terminal region, and a second frame region having a smaller width than the first frame region; a sealing material in the frame region between the first substrate and the second substrate, the sealing material configured to allow the first substrate to adhere to the second substrate; a first planarization film at a sealing material-side of the first substrate; and a second planarization film at a sealing material-side of the second substrate. A groove overlapping the sealing material as viewed from above is formed in at least one of the first or second planarization film in the second frame region.

With this feature, the sealing material is interposed between the first substrate and the second substrate, and then pressure is applied. This sealing material allows the first substrate to adhere to the second substrate, that is, the first substrate and the second substrate are bonded together via the sealing material. At this time, the sealing material in the second frame region is less compressed by the first planarization film (or the second planarization film). As a result, the sealing material has a smaller width (i.e., thickness) in the second frame region.

The sealing material has a most suitable (i.e., great) width in the first frame region when being formed. In other words, the sealing material is formed with a width sufficient to reliably provide the adhesive strength. In the second frame region, the sealing material is formed with the small width to correspond to a narrower frame without being restricted by the width of the sealing material in the first frame region. As a result, a narrow-frame display panel is obtained, which controls the finished width of the sealing material, and reliably provides most suitable adhesive strength in both the first and second frame regions.

In the display panel according to the another aspect of the present invention, the groove may be a through groove.

This feature reduces the compression force of the first planarization film (or the second planarization film) to the sealing material in the second frame region when the first substrate and the second substrate are bonded together. As a result, the sealing material has a much smaller width in the second frame region.

In the display panel according to the another aspect of the present invention, the groove may be a recessed groove.

In the display panel according to the another aspect of the present invention, the recessed groove may be formed in the first planarization film. The first substrate may include a first insulating substrate, and an insulating film on the first insulating substrate. The first planarization film may be provided in the second frame region on a surface of the insulating film to cover the insulating film. The recessed groove may be located between the sealing material and the insulating film.

In the display panel according to the another aspect of the present invention, the recessed groove may be formed in the second planarization film. The second substrate may include a second insulating substrate, and a black matrix on the second insulating substrate. The second planarization film may be provided in the second frame region on a surface of the black matrix to cover the black matrix. The recessed groove is located between the sealing material and the black matrix.

This feature prevents the sealing material from touching the black matrix in the second frame region, thereby preventing the panel from peeling off due to peeling of the black matrix.

In addition, the aspect and the another aspect of the present invention have an excellent advantage of providing a narrow-frame display panel which prevents reduction in the adhesive strength of the sealing material. Therefore, the present invention is preferably used as a display panel including a display element, which is a liquid crystal display element or an organic EL display element.

Advantages of the Invention

The present invention provides a narrow-frame display panel controlling the finished width of a sealing material, and reliably providing most suitable adhesive strength in both first and second frame regions.

BRIEF DESCRIPTION OF THE DRAWINGS

FIG. 33 is a top view of an organic EL display device according to another variation.

DESCRIPTION OF EMBODIMENTS

Embodiments of the present invention will be described hereinafter in detail with reference to the drawings. The present invention is not limited to the following embodiments.

First Embodiment

Figure 1:
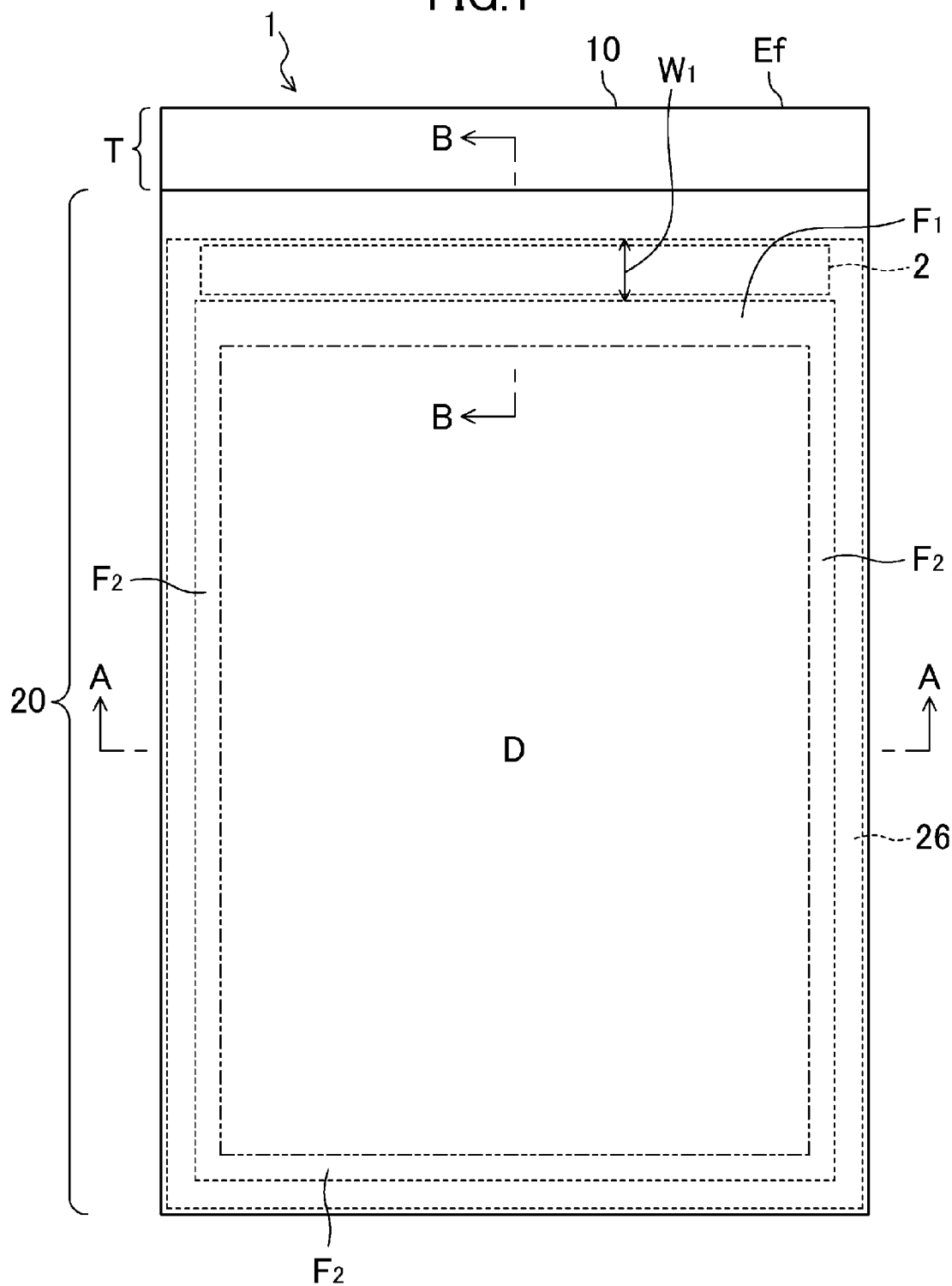
FIG. 1 is a top view of a liquid crystal display panel according to a first embodiment of the present invention.
Figure 2:
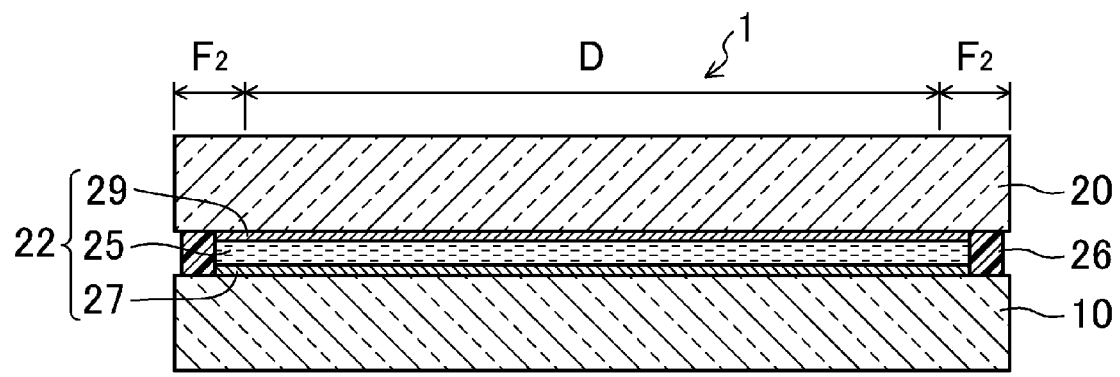
FIG. 2 is a cross-sectional view taken along the line A-A of FIG. 1.
Figure 3:
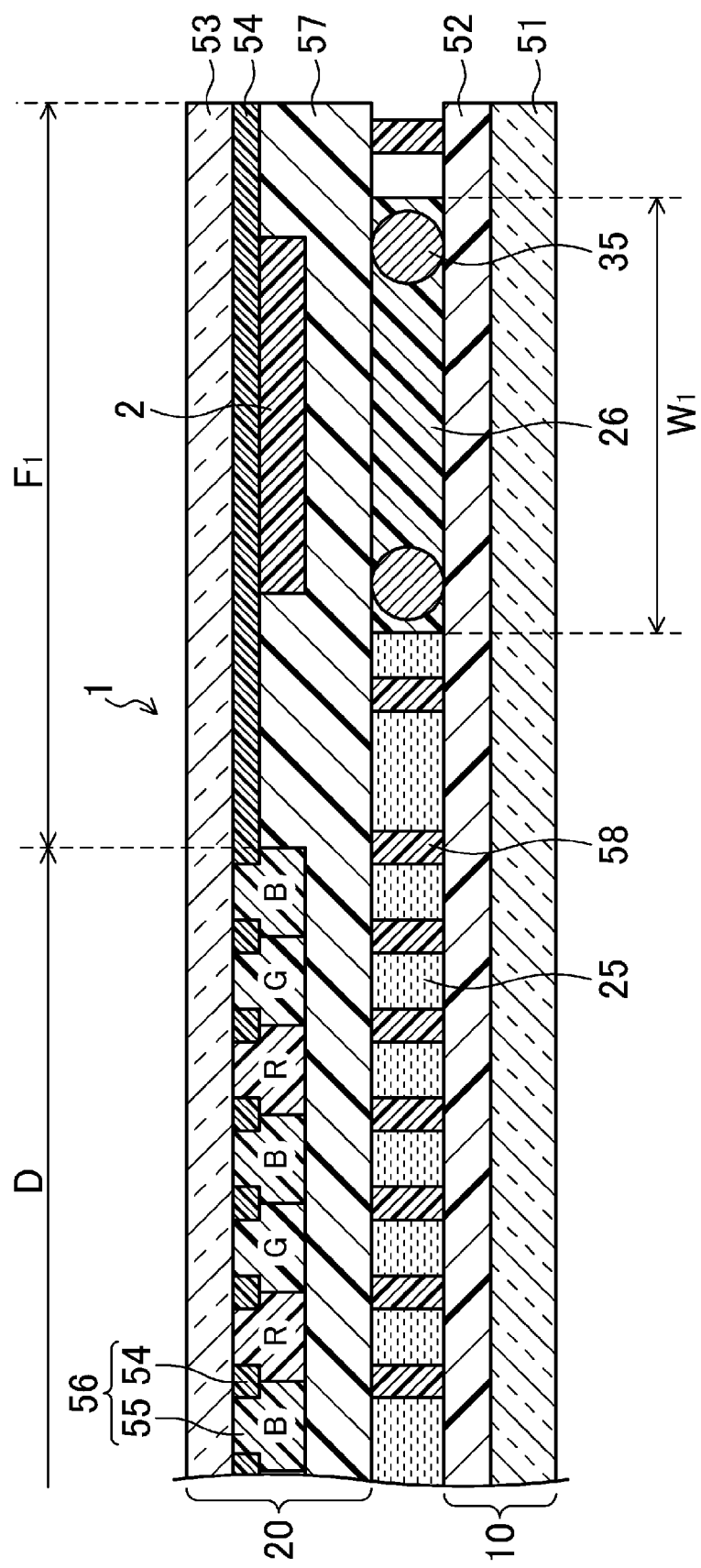
FIG. 3 is a cross-sectional view taken along the line B-B of FIG. 1.

FIG. 1 is a top view of a liquid crystal display panel according to a first embodiment of the present invention. FIG. 2 is a cross-sectional view taken along the line A-A of FIG. 1. FIG. 3 is a cross-sectional view taken along the line B-B of FIG. 1.

As shown in FIGS. 1-3, a liquid crystal display panel 1 includes a TFT substrate 10, a CF substrate 20, a liquid crystal layer 25, and a sealing material 26. The TFT substrate 10 is a first substrate. The CF substrate 20 is a second substrate facing the TFT substrate 10. The liquid crystal layer 25 is provided between the TFT substrate 10 and the CF substrate 20. The sealing material 26 allows the TFT substrate 10 to adhere to the CF substrate 20, and is provided in a frame shape to encapsulate the liquid crystal layer 25. This sealing material 26 surrounds the liquid crystal layer 25. The TFT substrate 10 and the CF substrate 20 are bonded together via the sealing material 26.

As shown in FIG. 3, spacers 35 are provided inside the sealing material 26 to restrict the cell gap (i.e., the distance between the TFT substrate 10 and the CF substrate 20) in frame regions (i.e., a wide frame region $F_1$ and a narrow frame region $F_2$).

As shown in FIG. 1, in the liquid crystal display panel 1, the TFT substrate 10 projects beyond the CF substrate 20 in an upper portion. A plurality of display lines such as gate lines and source lines, which will be described later, are drawn to the projecting region. The projecting region includes a pad receiving signals from outside and a pad including an IC mounted thereon, and a terminal region T including thereon an FPC mounted or an IC receiving control signals.

The liquid crystal display panel 1 has what is called a three-side-free structure. The terminal region T is located along only one side (i.e., the upper side Ef) of the TFT substrate 10.

The liquid crystal display panel 1 includes a display region D displaying images in an overlapping region between the TFT substrate 10 and the CF substrate 20. The display region D is formed by arranging pixels in a matrix. The pixels are the smallest units of an image.

A four-sided frame region is formed around the display region D to include the sealing material 26. As shown in FIGS. 1-3, one side of the frame region is formed, as the wide frame region $F_1$ with a greater width, at the terminal region. The other three sides are formed as the narrow frame region $F_2$ having a smaller width than the wide frame region $F_1$.

The three sides of the narrow frame region $F_2$ other than the wide frame region $F_1$ may not necessarily have the same width. For example, one of the three sides of the narrow frame region $F_2$ may have a smaller width than the other two sides of the narrow frame region $F_2$. On the other hand, for example, one of the three sides of the narrow frame region $F_2$ may have a greater width than the other two sides of the narrow frame region $F_2$.

The reason follows. For example, a gate driver circuit, a source driver circuit, and an SSD circuit, which control the display of images, are often mounted on the wide frame region $F_1$ or the two sides of the narrow frame region $F_2$, which are adjacent to the wide frame region $F_1$. However, such control circuits are less mounted on the side of the narrow frame region $F_2$, which faces the wide frame region $F_1$. There is thus a case where the side of the narrow frame region $F_2$, which faces the wide frame region $F_1$, is formed much narrower as long as peel strength falls within an acceptable range. There is also a case where this side is formed wider to increase the peel strength (i.e., the adhesive strength) of the two narrow frame region $F_2$ adjacent to the wide frame region $F_1$.

When the bonded structure of the TFT substrate 10 and the CF substrate 20 is cut-out, the widths of the three sides of the narrow frame region $F_2$ may be different (e.g., within a range from about tens of microns to about hundreds of microns). The widths of the three sides of the narrow frame region $F_2$ are not strictly the same.

As shown in FIG. 3, the TFT substrate 10 includes an insulating substrate 51, a base coating film (not shown), a semiconductor film (not shown) and a gate insulating film (not shown), and a plurality of gate lines (not shown). The insulating substrate 51 is, for example, a glass substrate, a plastic substrate, etc. The base coating film is provided on the insulating substrate 51. The semiconductor film and the gate insulating film are provided on the base coating film. The gate lines extend in parallel to each other on the semiconductor film and the gate insulating film. The TFT substrate 10 also includes an interlayer insulating film (not shown), a plurality of source lines (not shown), and a plurality of TFTs (not shown). The interlayer insulating film covers the gate lines. The source lines are provided on the interlayer insulating film, and extend in parallel to each other to intersect the gate lines. Each TFT is provided at the intersection between one of the gate lines and the corresponding one of the source lines, that is, in each pixel, in the display region D. The TFT substrate 10 further includes a gate driver circuit (not shown), a planarization film 52, a plurality of pixel electrodes 27 (see FIG. 2), and an alignment film (not shown). The gate driver circuit is mounted on the frame regions. The planarization film 52 covers the TFTs and the source lines. The pixel electrodes 27 are arranged in a matrix on the planarization film 52 and connected to the respective TFTs. The alignment film covers the pixel electrodes 27.

As shown in FIG. 3, the CF substrate 20 includes an insulating substrate 53, a black matrix 54, and a color filter 56. The insulating substrate 53 is, for example, a glass substrate, a plastic substrate, etc. The black matrix 54 is provided on the insulating substrate 53. The color filter 56 includes color layers 55 of red layers R, green layers G, and blue layers B provided in a lattice of the black matrix 54. The CF substrate 20 further includes a planarization film 57, a common electrode 29 (see FIG. 2), photo spacers 58, and an alignment film (not shown). The planarization film 57 covers the black matrix 54 and the color filter 56. The common electrode 29 (see FIG. 2) is provided on the planarization film 57. The photo spacers 58 provided like pillars on the planarization film 57. The alignment film (not shown) covers the common electrode 29. The photo spacers 58 may be provided on the TFT substrate 1.

As shown in FIG. 3, the color filter 56 including the black matrix 54 and the color layers 55 is provided in the display region D.

The color layers 55 are made of, for example, acrylic-based photosensitive resin. The color layers 55 are formed as follows. The photosensitive resin is applied onto the insulating substrate 53 including the black matrix 54, exposed to light via a photomask, and then developed to be patterned.

The black matrix 54 is provided between adjacent pairs of the color layers 55 in the display region D to segment a plurality of types of the color layers 55. The black matrix 54 is made of a metal material such as tantalum (Ta), chrome (Cr), molybdenum (Mo), nickel (Ni), titanium (Ti), copper (Cu), or aluminum (Al), a resin material dispersed with black pigment such as carbon, or a resin material formed by stacking light-transmitting color layers of a plurality of colors.

The planarization films 52 and 57 are made of a material such as acrylic-based resin having excellent adhesiveness with the materials of the black matrix 54 and the sealing material 26. These planarization films 52 and 57 are generally formed by spin coating or slit coating.

The photo spacers 58 are made of, for example, acrylic-based photosensitive resin, and formed by photolithography.

The liquid crystal layer 25 is made of, for example, a nematic liquid crystal material with electroptical characteristics.

As shown in FIG. 2, the liquid crystal display panel 1 according to this embodiment includes a liquid crystal display element 22. The liquid crystal display element 22 includes the pixel electrodes 27, the liquid crystal layer 25 formed on the pixel electrodes, and the common electrode 29 formed on the liquid crystal layer 25.

As shown in FIG. 1, the sealing material 26 in a rectangular shape surrounding the display region D. The width of the sealing material 26 is not particularly limited, but may fall within a range, for example, from 0.2 mm to 1.6 mm.

More specifically, the sealing material 26 provided in the wide frame region $F_1$ has a greater width than the sealing material 26 provided in the narrow frame region $F_2$. The width of the sealing material 26 provided in the narrow frame region $F_1$ may fall within a range, for example, from 0.4 mm to 1.6 mm. The width of the sealing material 26 provided in the narrow frame region $F_2$ may fall within a range, for example, from 0.2 mm to 0.8 mm.

The sealing material 26 is preferably, for example, ultraviolet curable resin such as acrylic-based resin, urethane-based resin, polyester-based resin, or epoxy-based resin, heat-curable resin such as epoxy-based resin, light curable resin including visible light curable resin such as acrylic-based resin, methacryl-based resin, epoxy-based resin, or silicon-based resin. The light curable resin is irradiated with light such as visible light to be cured. These types of resin may be used alone, or two or more types may be used at the same time.

In the liquid crystal display panel 1, each pixel electrode 27 forms a pixel. In each pixel, a predetermined voltage is applied to the liquid crystal layer 25. The liquid crystal display panel 1 utilizes the characteristics that the alignment of liquid crystal molecules changes according to the magnitude of the voltage (i.e., an electric line) applied to the liquid crystal layer 25. For example, the transmittance of the light incident from a back light is controlled to display images.

As shown in FIGS. 1 and 3, one of the features of this embodiment is that a dummy structure 2 is provided in the CF substrate 20 in the wide frame region $F_1$. The dummy structure 2 overlaps the sealing material 26 as viewed from above.

As shown in FIG. 3, the dummy structure 2 is provided on the surface of the black matrix 54 in the wide frame region $F_1$. The CF substrate 20 includes, in the wide frame region $F_1$, the planarization film 57 covering the dummy structure 2. The planarization film 57 is located between the sealing material 26 and the dummy structure 2.

In this structure, the sealing material 26 is interposed between the TFT substrate 10 and the CF substrate 20, and pressure is applied. Then, the sealing material 26 is allows the TFT substrate 10 to adhere to the CF substrate 20, that is, the TFT substrate 10 and the CF substrate 20 are bonded together via the sealing material 26 to form a bonded structure. In the formation of this bonded structure, the sealing material 26 in the wide frame region $F_1$ is compressed by the dummy structure 2, and the planarization film 57 covering the dummy structure 2. As a result, the sealing material 26 has a great width $W_1$ (i.e., a great thickness) in the wide frame region $F_1$.

In the narrow frame region $F_2$, the sealing material 26 has a most suitable width in the formation of the sealing material. In other words, the sealing material 26 is formed with a width sufficient to reliably provide the adhesive strength. In the wide frame region $F_1$ at the terminal region T, the sealing material 26 is formed with the great width without being restricted by the width of the sealing material 26 in the frame region $F_2$. As a result, the narrow-frame liquid crystal display panel 1 is obtained, which controls the finished width of the sealing material 26, and reliably provides most suitable adhesive strength in both the wide frame region $F_1$ and the narrow frame region $F_2$.

In this embodiment, the dummy structure 2 is made of the same material as a color layer 28. For example, acrylic-based photosensitive resin colored red, green, or blue is applied onto the surface of the black matrix 54 in the wide frame region $F_1$. The applied photosensitive resin is exposed to light via a photomask, and then developed to be patterned. Then, the dummy structure 2 and the color layer 28 are formed at the same time. The dummy structure 2 is therefore provided without increasing the manufacturing steps.

Although not shown in FIG. 3, a portion of the planarization film 57, which overlaps the dummy structure 2 as viewed from above, projects due to the thickness of the dummy structure 2. For example, where the dummy structure 2 has a thickness of 1 micron, projection with a thickness about half the thickness (i.e., about 0.5 micron) of the dummy structure 2 is formed in the planarization film 57. Thus, the distance (i.e., the gap) between the planarization film 52 in the TFT substrate 10 and the planarization film 57 decreases by the projection. The spacers 35 with sizes decreasing by the projection are provided inside the sealing material 26.

If the thickness of this projection increases the difference between the distance between the planarization films 52 and 57 in the wide frame region $F_1$ and the distance between the planarization films 52 and 57 in the narrow frame region $F_2$, the narrow frame region $F_2$ may have another dummy structure to control the distance between the planarization films 52 and 57 in the narrow frame region $F_2$. For example, a dummy structure smaller than the dummy structure 2 in the wide frame region $F_1$ may be provided.

Figure 4:
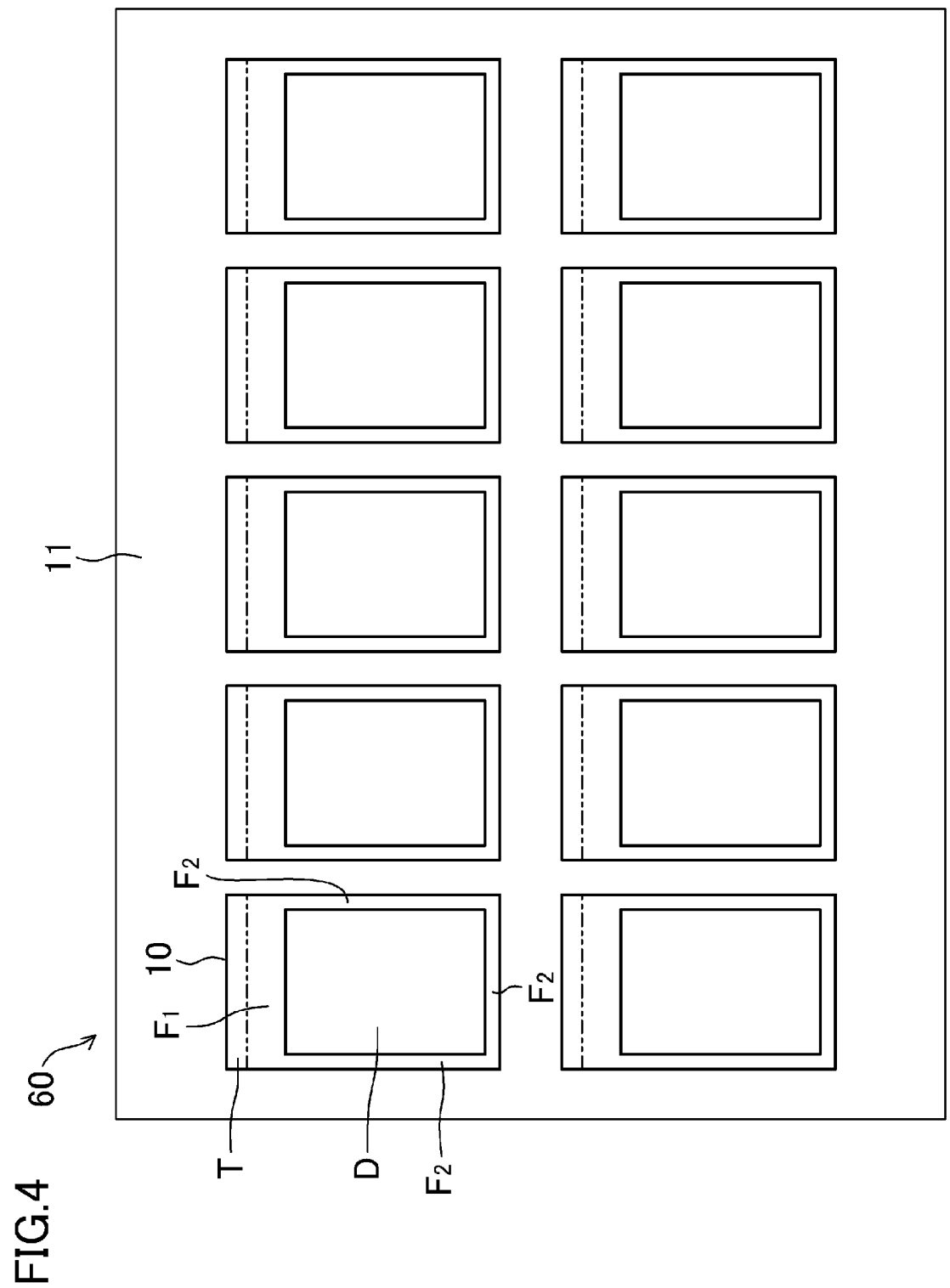
FIG. 4 is a top view illustrating a mother substrate for a TFT substrate in the liquid crystal display panel according to the first embodiment of the present invention.
Figure 5:
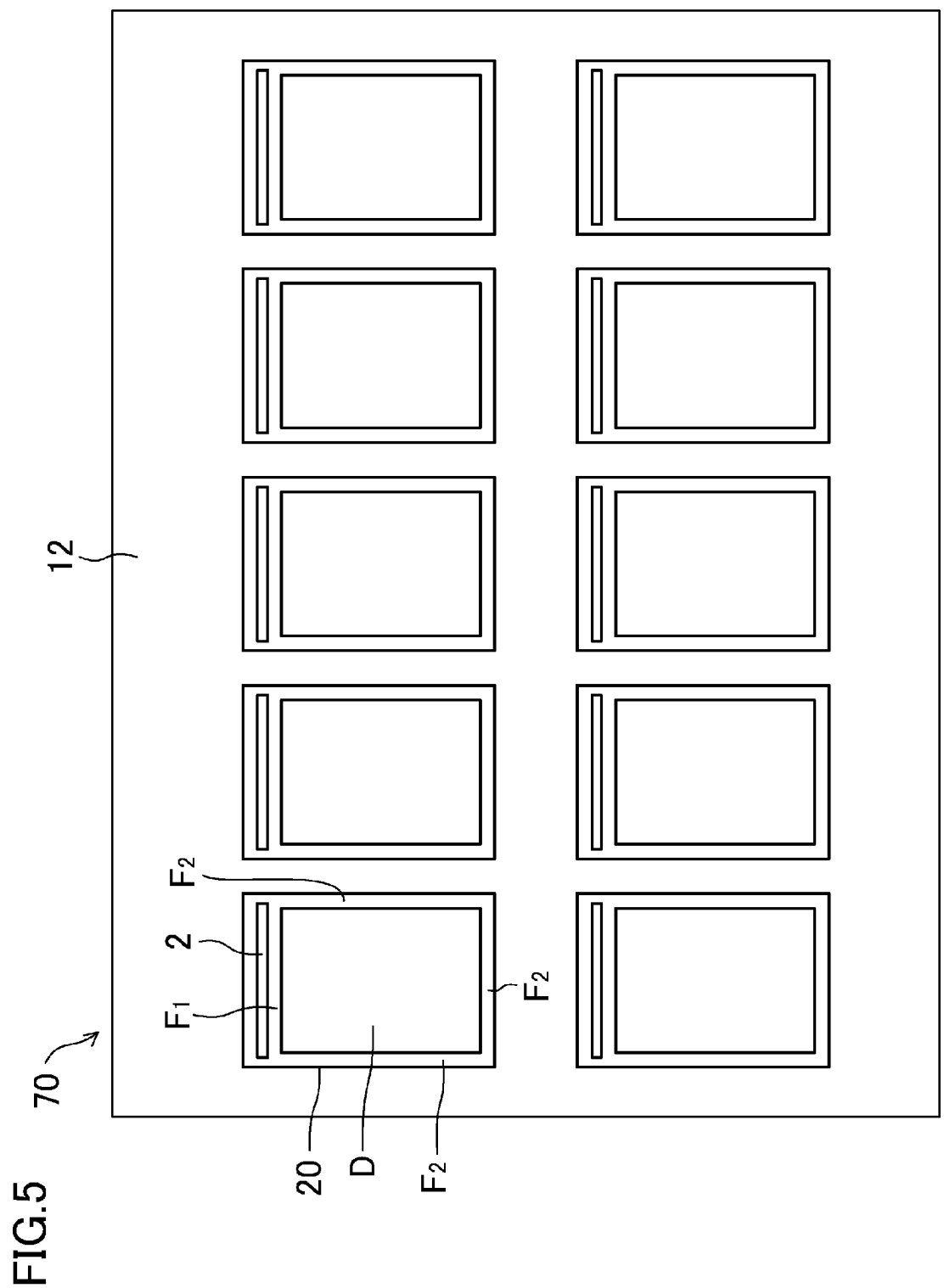
FIG. 5 is a top view illustrating a mother substrate for a CF substrate in the liquid crystal display panel according to the first embodiment of the present invention.
Figure 6:
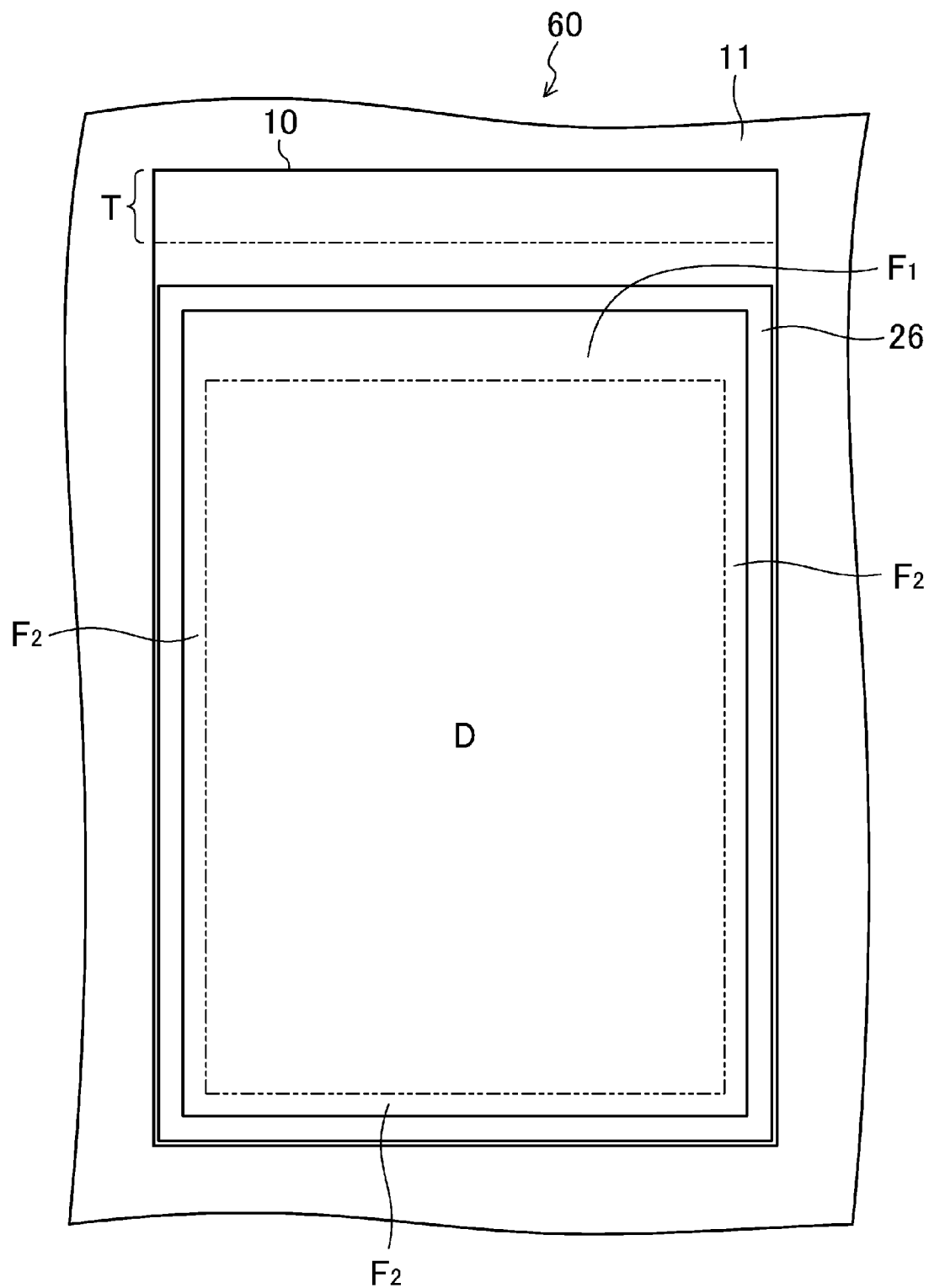
FIG. 6 is a top view illustrating a method of forming a sealing material for the liquid crystal display panel according to the first embodiment of the present invention.
Figure 7:
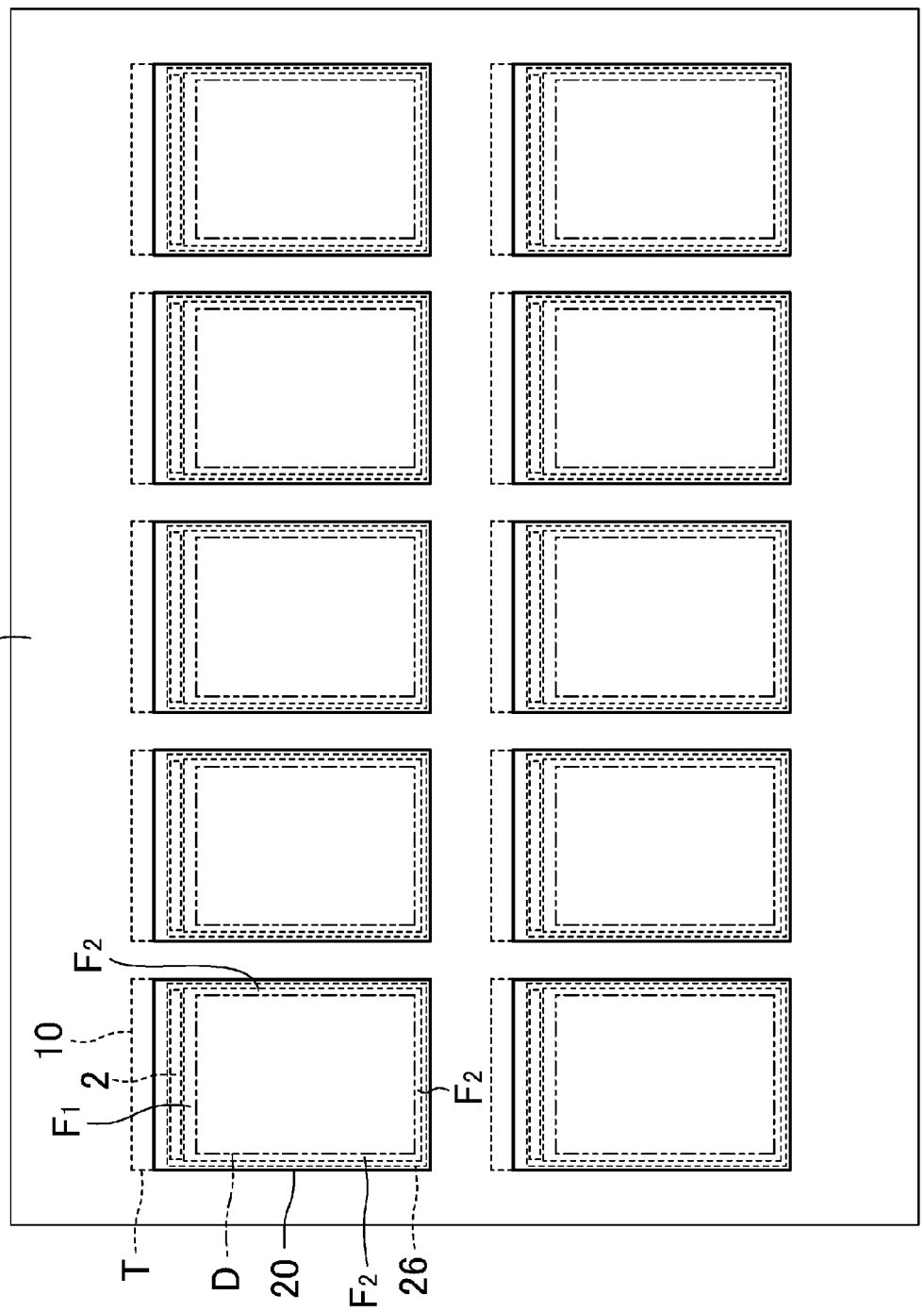
FIG. 7 is a top view illustrating a bonded structure formed by bonding the mother substrate for the TFT substrate to the mother substrate for the CF substrate.

Next, an example method of manufacturing the liquid crystal display panel according to this embodiment will be described. FIG. 4 is a top view illustrating a mother substrate for the TFT substrate in the liquid crystal display panel according to the first embodiment of the present invention. FIG. 5 is a top view illustrating a mother substrate for the CF substrate in the liquid crystal display panel according to the first embodiment of the present invention. FIG. 6 is a top view illustrating formation of the sealing material in the liquid crystal display panel according to the first embodiment of the present invention. FIG. 7 is a top view illustrating a bonded structure formed by bonding the mother substrate for the TFT substrate to the mother substrate for the CF substrate. The manufacturing method according to this embodiment includes fabrication of the mother substrates, formation of the sealing material, injection of the liquid crystal material, and formation and cut-out of the bonded structure.

Fabrication of Mother Substrates

The TFTs, the planarization film 52, the pixel electrodes 27, etc., are patterned on the substrate body 11 made of, for example, alkali-free glass to form a plurality of active element layers. Each active element layer forms the display region D. Then, the photo spacers 58 are formed by photolithography. More specifically, acrylic-based photosensitive resin is applied onto the entire substrate including the planarization film 52, etc., by spin coating or slit coating. The applied photosensitive resin is exposed to light via a photomask, and then developed to form the photo spacers 58. Where the liquid crystal display panel 1 is of a vertical alignment type, an alignment film is formed in the center of a pixel at the same time when these photo spacers 58 are formed. Next, polyimide-based resin is applied onto the entire substrate including the photo spacers 58 by printing. After that, where the liquid crystal display panel 1 is of a horizontal alignment type, alignment is performed by rubbing to fabricate a mother substrate 60 for the TFT substrate. The mother substrate 60 includes a plurality of display regions D and a plurality of terminal regions T arranged in a matrix shown in FIG. 4. In this embodiment, ten TFT substrates 10 are fabricated from the single mother substrate 60 as shown in FIG. 4.

The black matrix 54, the color layers 55, the dummy structure 2, the planarization film 57, the common electrode 29, etc., are patterned on a substrate body 12 made of, for example, alkali-free glass to form a plurality of CF element layers each forming the display region D. Then, an alignment film is formed on the surface to fabricate a mother substrate 70 for the CF substrate. The mother substrate 70 includes a plurality of display regions D arranged in a matrix shown in FIG. 5 and the dummy structures 2. In this embodiment, ten CF substrates 20 are fabricated from the single mother substrate 70 as shown in FIG. 5.

Formation of Sealing Material

Next, the sealing material 26 with a width of, for example, 0.6 mm is drawn in a frame shape in the four sides of the frame regions in each TFT substrate 10 using a dispenser. At this time, the sealing material 26 is formed in the frame shape along the four sides of the TFT substrate 10 as shown in FIG. 6.

Injection of Liquid Crystal Material

Then, in a vacuum atmosphere, the liquid crystal material is dropped and injected inside the display region D (i.e., inside the sealing material 26) in each TFT substrate 10 fabricated on the mother substrate 60. The liquid crystal material is dropped by, for example, a dropper with a function of dropping liquid crystal materials. The liquid crystal material is dropped while the dropper moves over the entire substrate.

Formation of Bonded Structure

First, the TFT substrate 10 and the CF substrate 20, on which the liquid crystal material has been dropped in the above-described injection of the liquid crystal material, are bonded together under reduced pressure such that the respective display regions D overlap each other. At this time, as shown in FIG. 7, the sealing material 26 overlaps the dummy structure 2 in the wide frame region $F_1$ as viewed from above.

Then, the bonded structure is exposed to atmospheric pressure to diffuse the liquid crystal material, thereby forming the liquid crystal layer 25. Heat and pressure treatment is performed under predetermined conditions (e.g., under a pressure of 2.5 MPa at a temperature of 150° C. for 30 minutes) to allow the sealing material 26 to adhere to the CF substrate 20. As shown in FIG. 7, the TFT substrate 10 and the CF substrate 20 are bonded together via the sealing material 26.

At this time, as described above, the dummy structure 2 overlapping the sealing material 26 as viewed from above is provided in the CF substrate 20 in the wide frame region $F_1$. The sealing material 26 in the wide frame region $F_1$ is compressed by the dummy structure 2 and the planarization film 57 covering the dummy structure 2. As a result, the sealing material 26 has a great width $W_1$ in the wide frame region $F_1$.

In the narrow frame region $F_2$, the sealing material 26 has a most suitable width in the formation of the sealing material. In other words, the sealing material 26 is formed with a width sufficient to reliably provide the adhesive strength. In the wide frame region $F_1$, the sealing material 26 is formed with the great width without being restricted by the width of the sealing material 26 in the frame region $F_2$.

Next, the frame regions of the bonded structure are irradiated with UV light to temporarily cure the sealing material 26, and then heated to completely cure the sealing material 26. As a result, as shown in FIG. 7, the mother substrates 60 and 70 are bonded together to form a bonded structure 30 encapsulating the liquid crystal layer 25.

Cut-Out

After that, the cutting edge of a supersteel wheel abuts on the front and back surfaces of the bonded structure 30 to cut the bonded structure 30 into the display regions D along division lines of the bonded structure 30. As a result, the liquid crystal display panel 1 shown in FIGS. 1-3 is manufactured.

The width of the sealing material 26 in the wide frame region $F_1$ may be set to, for example, 1.0 mm.

The supersteel wheel used for the cut-out is a disk-like cutting edge made of, for example, a hard metal alloy such as tungsten carbide. Each side surface of the disk projects like a taper toward the center of the disk in the thickness direction. The supersteel wheel may have a projection at a tapered cutting edge.

Second Embodiment

Figure 8:
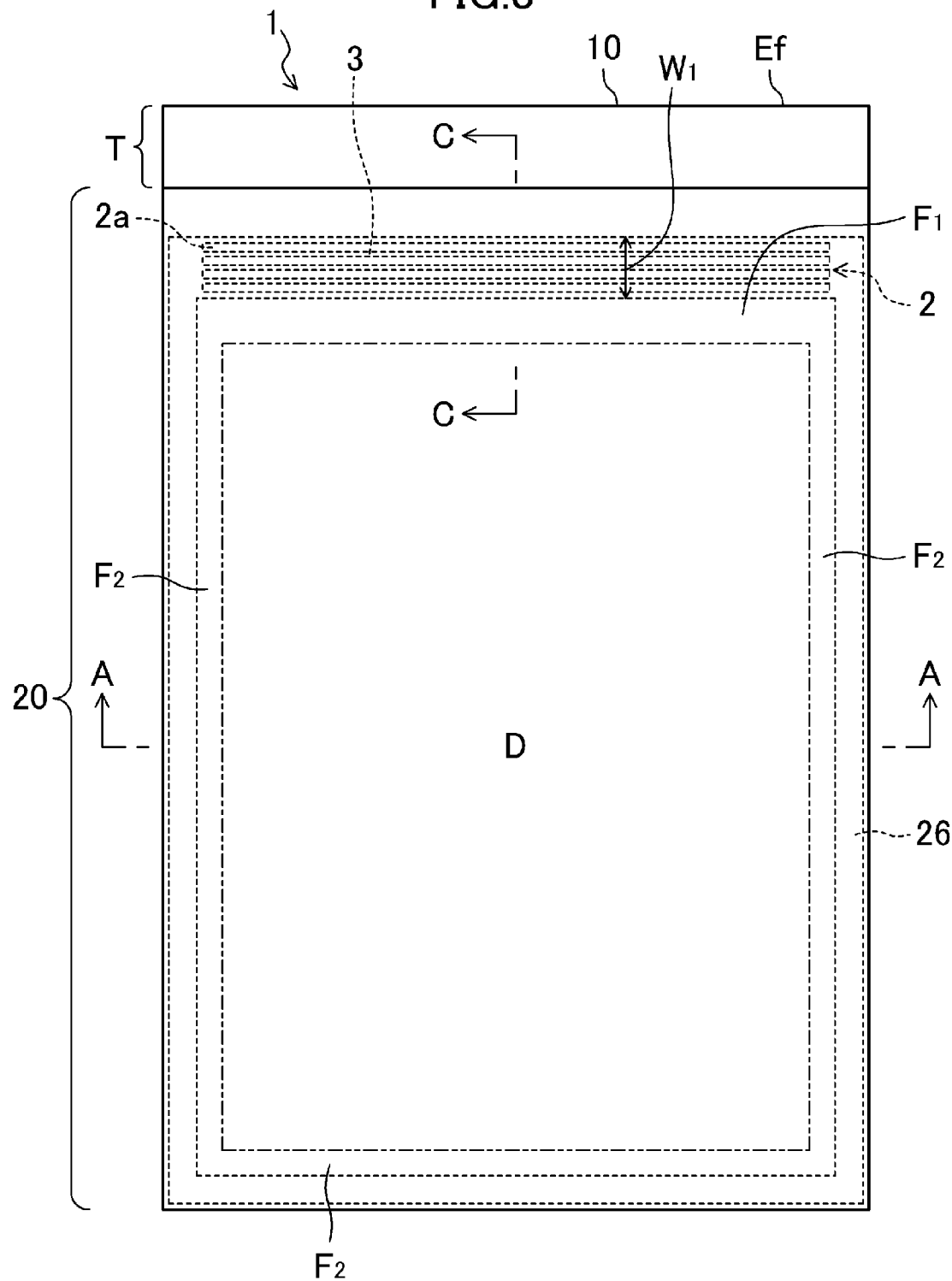
FIG. 8 is a top view of a liquid crystal display panel according to a second embodiment of the present invention.
Figure 9:
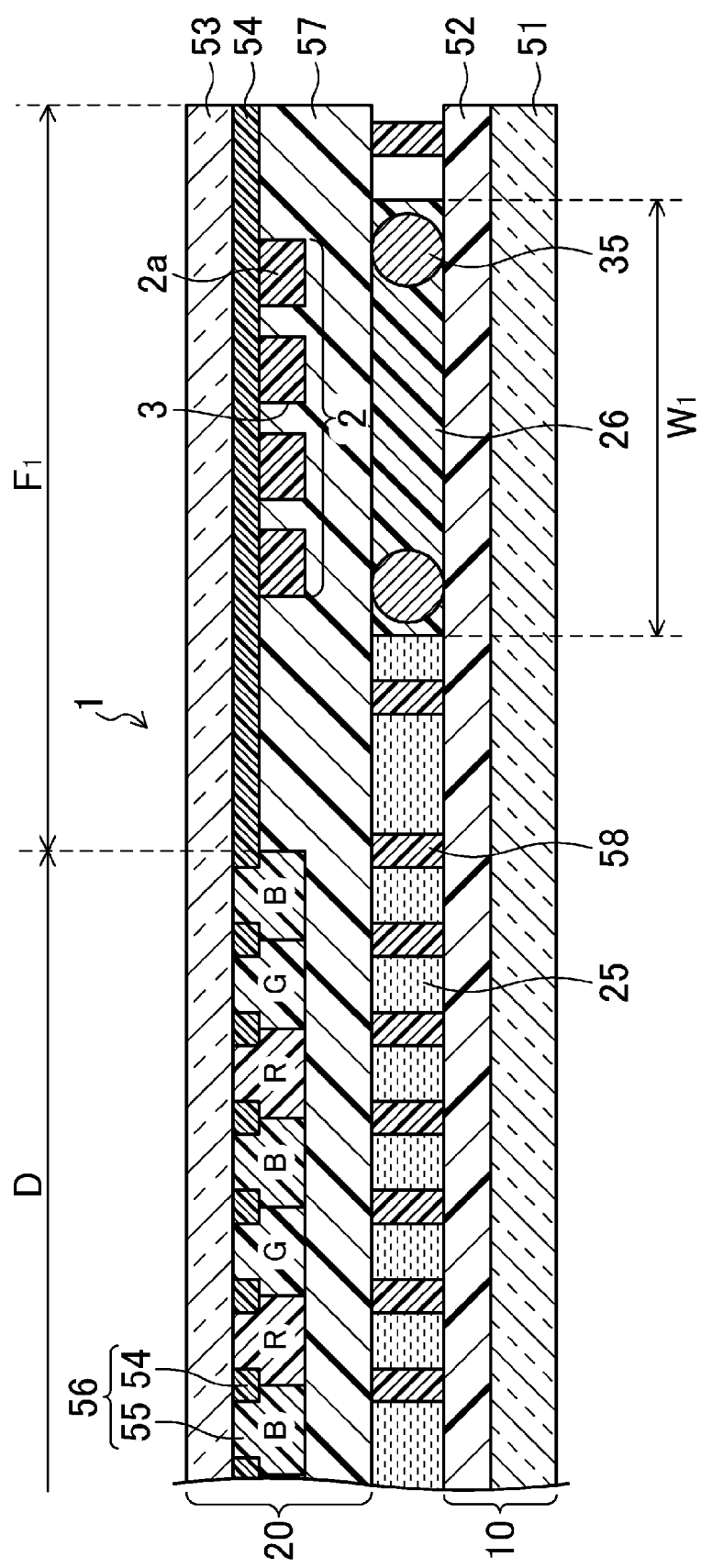
FIG. 9 is a cross-sectional view taken along the line C-C of FIG. 8.

Next, a second embodiment of the present invention will be described. FIG. 8 is a top view of a liquid crystal display panel according to the second embodiment of the present invention. FIG. 9 is a cross-sectional view taken along the line C-C of FIG. 8. In this embodiment, the same reference characters as those shown in the first embodiment are used to represent equivalent elements, and the explanation thereof will be omitted. The whole structure and the manufacturing method of the liquid crystal display panel are similar to what is described in the first embodiment, and detailed explanation thereof will be omitted.

Features of this embodiment are as follows. As shown in FIGS. 8 and 9, a dummy structure 2 has through grooves 3 dividing a dummy structure 2. A planarization film 57 is in contact with a black matrix 54 via the through grooves 3.

More specifically, the planarization film 57 covers the dummy structure 2 and the black matrix 54. The planarization film 57 is in contact with the black matrix 54 via the through grooves 3 dividing the dummy structure 2.

The dummy structure 2 is made of the same material as the color layer 28, for example, acrylic-based photosensitive resin etc. The dummy structure 2 is highly adhesive with the material of the black matrix 54 (e.g., a metal material such as chrome (Cr), a resin material dispersed with black pigment such as carbon, or a resin material formed by stacking light-transmitting color layers of a plurality of colors). As compared to the adhesiveness between an insulating substrate 53 such as a glass substrate and the black matrix 54, or the adhesiveness between the sealing material 26 and the planarization film 57, the adhesiveness among the dummy structure 2, the black matrix 54, and the planarization film 57 is low. It is thus conceivable that the dummy structure 2 on the black matrix 54 peels off the black matrix 54.

In this embodiment, as described above, the planarization film 57 is made of a material (e.g., acrylic-based resin) highly adhesive with the material of the black matrix 54. In addition, the dummy structure 2 has the through grooves 3, via which the planarization film 57 is in contact with the black matrix 54. This structure increases the contact area between the planarization film 57 and the black matrix 54, which cover the dummy structure 2. In addition to the advantages of the above-described first embodiment, the dummy structure 2 on the black matrix 54 is prevented from peeling off the black matrix 54.

In this embodiment, as shown in FIGS. 8 and 9, the dummy structure 2 includes a plurality of linear dummy structures 2a. These linear dummy structures 2a are spaced apart from each other at predetermined intervals to interpose one of the through grooves 3 between each pair of the linear dummy structures 2a.

Third Embodiment

Figure 10:
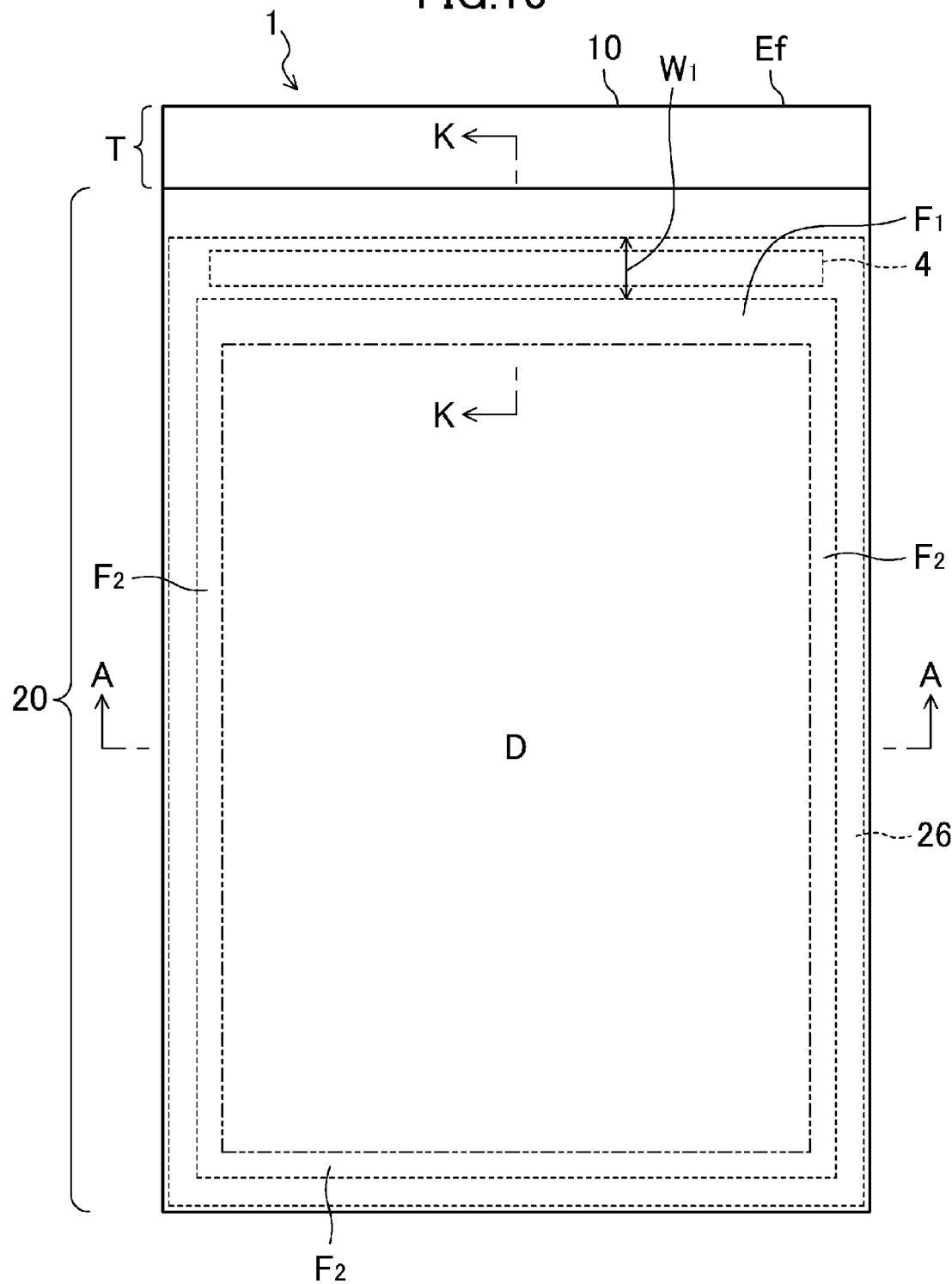
FIG. 10 is a top view of a liquid crystal display panel according to a third embodiment of the present invention.
Figure 11:
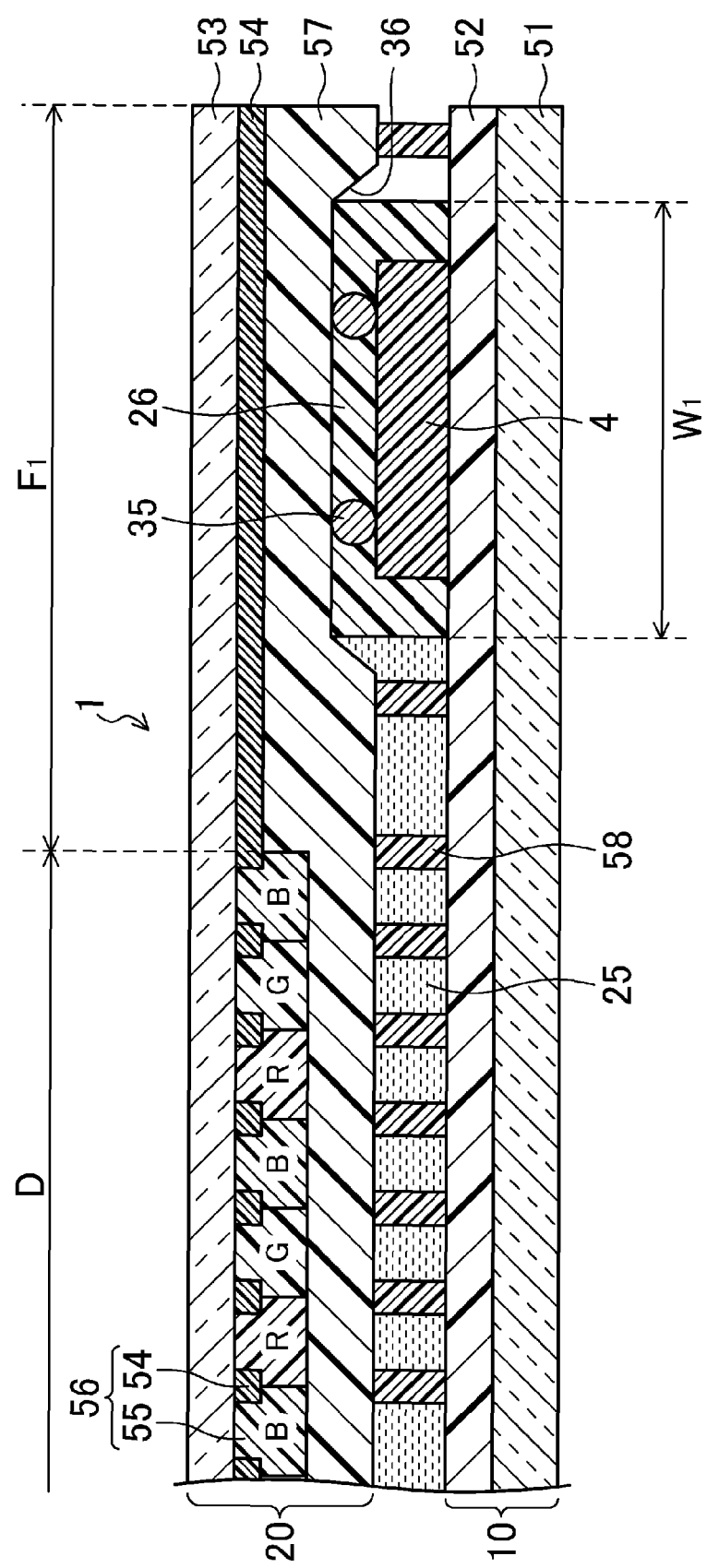
FIG. 11 is a cross-sectional view taken along the line K-K of FIG. 10.

Next, a third embodiment of the present invention will be described. FIG. 10 is a top view of a liquid crystal display panel according to the third embodiment of the present invention. FIG. 11 is a cross-sectional view taken along the line K-K of FIG. 10. In this embodiment, the same reference characters as those shown in the first embodiment are used to represent equivalent elements, and the explanation thereof will be omitted. The whole structure and the manufacturing method of the liquid crystal display panel are similar to what is described in the first embodiment, and detailed explanation thereof will be omitted.

A feature of this embodiment is as follows. As shown in FIGS. 10 and 11, a dummy structure 4 overlapping a sealing material 26 as viewed from above is formed on a TFT substrate 10 in a wide frame region $F_1$.

More specifically, as shown in FIG. 11, this dummy structure 4 is formed on the surface of a planarization film 52 in the wide frame region $F_1$. The sealing material 26 is provided on the TFT substrate 10 to cover the dummy structure 4.

With this structure, in the above-described formation of the bonded structure, the sealing material 26 in the wide frame region $F_1$ is compressed by the dummy structure 4. As a result, the sealing material 26 has a great width $W_1$ in the wide frame region $F_1$.

In the narrow frame region $F_2$, the sealing material 26 has a most suitable width in the formation of the sealing material. In other words, the sealing material 26 is formed with a width sufficient to reliably provide the adhesive strength. In the wide frame region $F_1$ at the terminal region T, the sealing material 26 is formed with the great width without being restricted by the width of the sealing material 26 in the frame region $F_2$. As a result, a narrow-frame liquid crystal display panel 1 is obtained, which controls the finished width of the sealing material 26, and reliably provides most suitable adhesive strength in both the wide frame region $F_1$ and the narrow frame region $F_2$.

In this embodiment, the dummy structure 4 is made of the same material (e.g., acrylic-based photosensitive resin) as photo spacers 58. Then, the photo spacers 58 and the dummy structure 4 can be formed at the same time. The dummy structure 4 is therefore provided without increasing the manufacturing steps.

As compared to the case where the dummy structure 4 is made of the same material as the color layer 28 as in the above-described first embodiment, the dummy structure 4 has a constant thickness. The dummy structure 4 with a designed thickness is formed. The reason follows. In the above-described first embodiment, since the planarization film 57 is provided on the dummy structure 2, the thickness of the dummy structure 2 may vary depending on the conditions of forming this planarization film 57. In this embodiment, the dummy structure 4 is provided on the planarization film 52 similarly to the photo spacers 58, thereby preventing variations in the thickness of the dummy structure 4 caused by the conditions of forming the planarization film 52.

The liquid crystal display panel 1 according to this embodiment is manufactured as follows. First, in the above-described fabrication of the mother substrates, acrylic-based photosensitive resin is applied onto the entire substrate including the planarization film 52, etc., by spin coating. The applied photosensitive resin is exposed to light via a photomask, and then developed to form the photo spacers 58 and the dummy structure 4 at the same time. As a result, a mother substrate 60 for the TFT substrate is fabricated.

Then, as in the above-described first embodiment, after a mother substrate 70 for the CF substrate is fabricated, the sealing material 26 covers the dummy structure 4 in the above-described formation of the sealing material to overlap the dummy structure 4 in the wide frame region $F_1$ as viewed from above.

In this embodiment, as shown in FIG. 11, the planarization film 57 has a recessed groove 36 to contain the sealing material 26. This recessed groove 36 is formed by exposing the planarization film 57 on the substrate body 12 to light in the above-described fabrication of the mother substrate 70 for the CF substrate. More specifically, for example, the recessed groove 36 is formed by exposing to light, the acrylic-based resin having been applied to form the planarization film 57. The amount of exposure is controlled using a photomask with an aperture ratio reduced to half or less.

Next, as in the above-described first embodiment, the injection of the liquid crystal material, and the formation and the cut-out of the bonded structure are performed, thereby manufacturing the liquid crystal display panel 1 shown in FIGS. 10 and 11.

Fourth Embodiment

Figure 12:
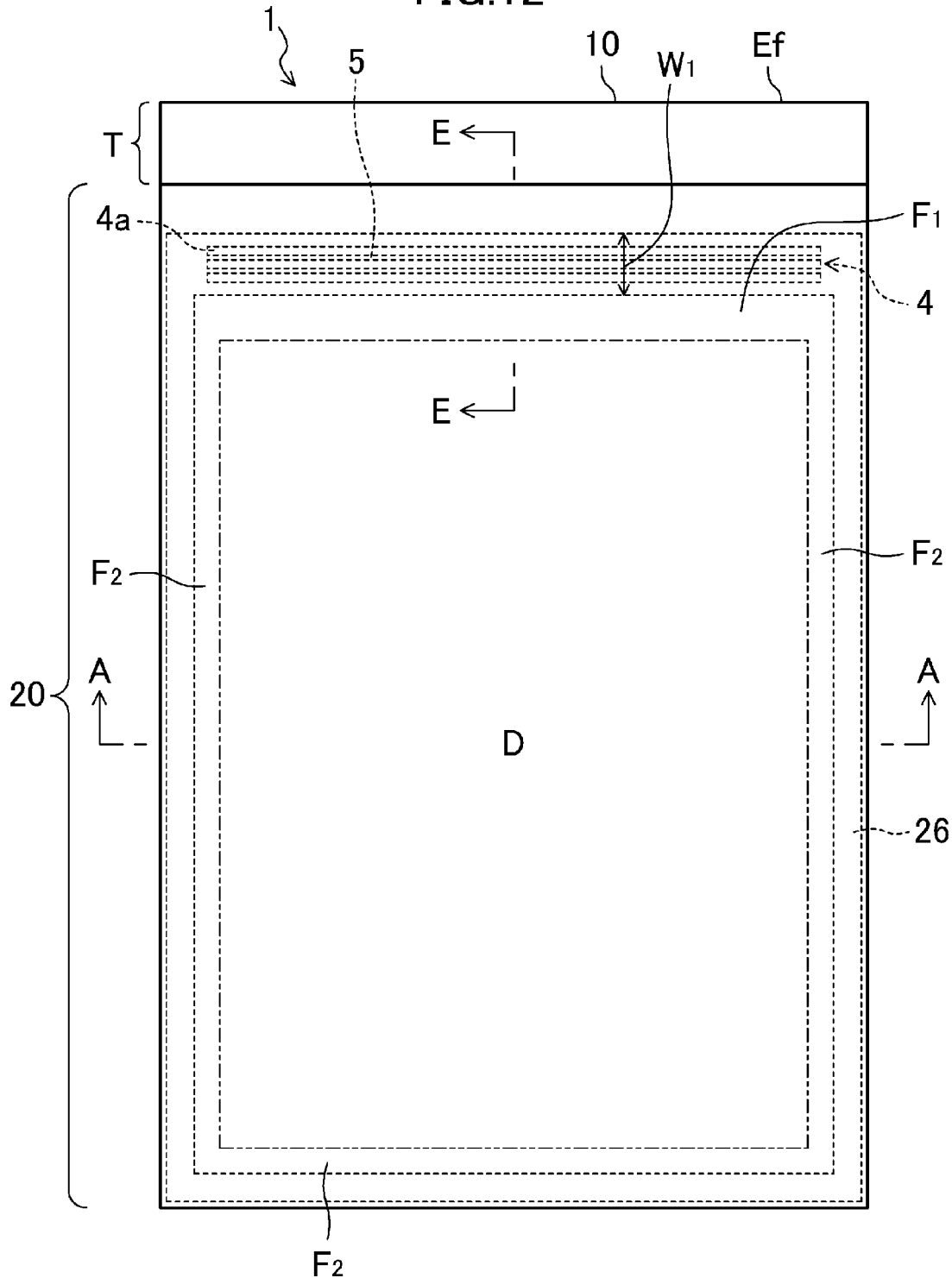
FIG. 12 is a top view of a liquid crystal display panel according to a fourth embodiment of the present invention.
Figure 13:
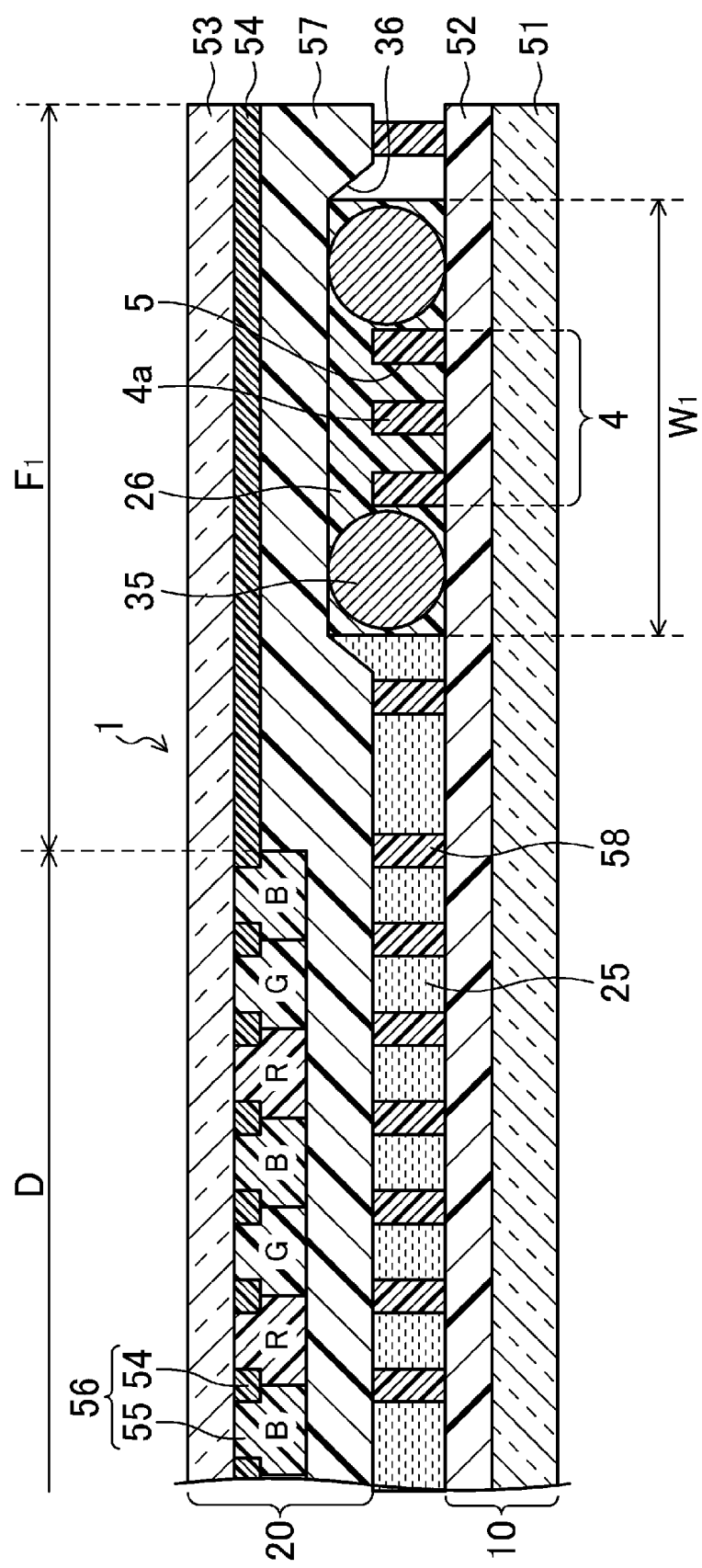
FIG. 13 is a cross-sectional view taken along the line E-E of FIG. 12.

Next, a fourth embodiment of the present invention will be described. FIG. 12 is a top view of a liquid crystal display panel according to the fourth embodiment of the present invention. FIG. 13 is a cross-sectional view taken along the line E-E of FIG. 12. In this embodiment, the same reference characters as those shown in the first and third embodiments are used to represent equivalent elements, and the explanation thereof will be omitted. The whole structure and the manufacturing method of the liquid crystal display panel are similar to what is described in the third embodiment, and detailed explanation thereof will be omitted.

Features of this embodiment are as follows. As shown in FIGS. 12 and 13, a dummy structure 4 has through grooves 5 dividing the dummy structure 4. A sealing material 26 is in contact with a planarization film 52 via the through grooves 5.

As described above, the dummy structure 4 is made of the same material as the photo spacers 58, for example, acrylic-based photosensitive resin, etc. As compared to the adhesiveness between an insulating substrate 51 such as glass substrate and the planarization film 52, or the adhesiveness between the sealing material 26 and the planarization film 52, the adhesiveness between the dummy structure 4 and the planarization film 52 is low. It is thus conceivable that the dummy structure 4 on the planarization film 52 peels off the planarization film 52.

On the other hand, as described above, the planarization film 52 is made of a material (e.g., acrylic-based resin) highly adhesive with the material (e.g., acrylic-based resin or epoxy-based resin) of the sealing material 26. In addition, the dummy structure 4 has the through grooves 5, via which the sealing material 26 is in contact with the planarization film 52. This structure increases the contact area between the planarization film 52 and the sealing material 26, which covers the dummy structure 4 and is highly adhesive to the planarization film 52. In addition to the advantages of the above-described third embodiment, the dummy structure 4 on the planarization film 52 is prevented from peeling off the planarization film 52.

In this embodiment, as shown in FIGS. 12 and 13, the dummy structure 4 includes a plurality of linear dummy structures 4a. These linear dummy structures 4a are spaced apart from each other at predetermined intervals to interpose one of the through grooves 5 between each pair of the linear dummy structures 4a.

Fifth Embodiment

Figure 14:
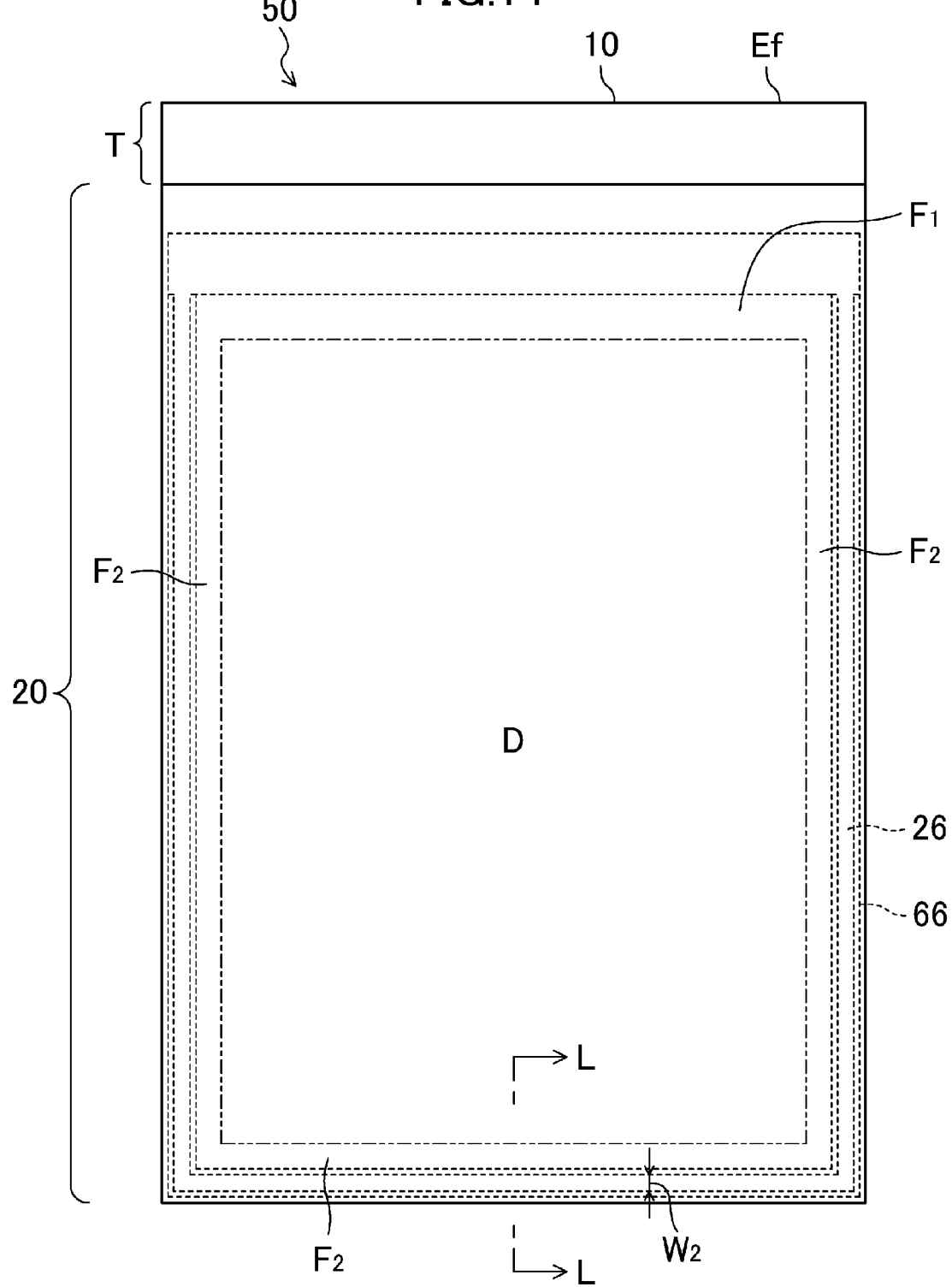
FIG. 14 is a top view of a liquid crystal display panel according to a fifth embodiment of the present invention.
Figure 15:
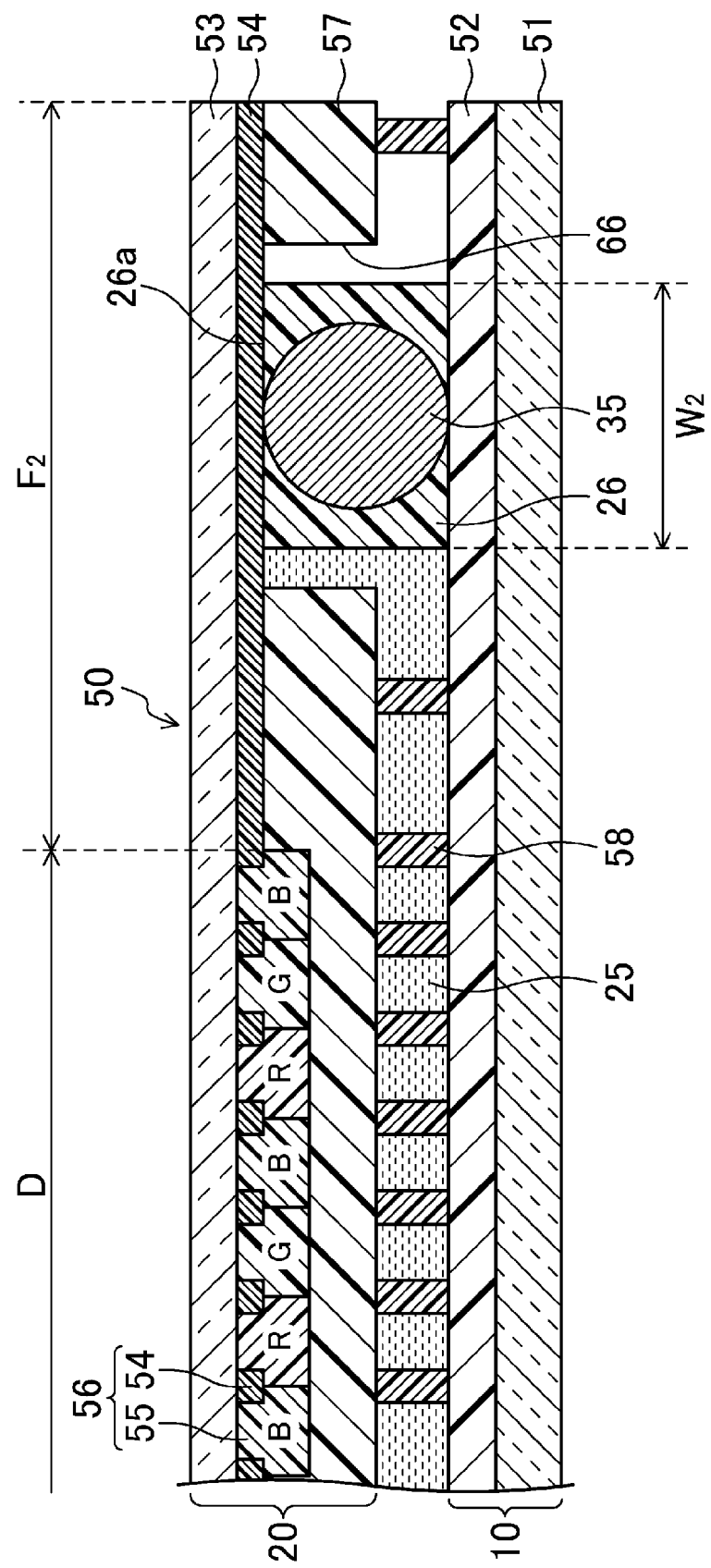
FIG. 15 is a cross-sectional view taken along the line L-L of FIG. 14.

Next, a fifth embodiment of the present invention will be described. FIG. 14 is a top view of a liquid crystal display panel according to the fifth embodiment of the present invention. FIG. 15 is a cross-sectional view taken along the line L-L of FIG. 14. In this embodiment, the same reference characters as those shown in the first embodiment are used to represent equivalent elements, and the explanation thereof will be omitted. The whole structure and the manufacturing method of the liquid crystal display panel are similar to what is described in the first embodiment, and detailed explanation thereof will be omitted.

A feature of this embodiment is as follows. As shown in FIGS. 14 and 15, a planarization film 57 of a CF substrate 20 has, in a narrow frame region $F_2$, a through groove 66 overlapping a sealing material 26 as viewed from above.

More specifically, the planarization film 57 has the through groove 66 is formed in to divide the planarization film 57. Via this through groove 66, the sealing material 26 (i.e., an entire surface 26a of the sealing material 26 in the CF substrate 20) is in contact with the black matrix 54.

In this structure, the sealing material 26 is interposed between a TFT substrate 10 and the CF substrate 20, and pressure is applied. Then, the sealing material 26 allows the TFT substrate 10 to adhere to the CF substrate 20, that is, the TFT substrate 10 and the CF substrate 20 are bonded together via the sealing material 26 to form a bonded structure. In the formation of this bonded structure, the sealing material 26 in the narrow frame region $F_2$ is less compressed by the planarization film 57. As a result, the sealing material 26 has a small width $W_2$ (i.e., a small thickness) in the narrow frame region $F_2$.

In the wide frame region $F_1$, the sealing material 26 has a most suitable width in the formation of the sealing material. In other words, the sealing material 26 is formed with a width sufficient to reliably provide the adhesive strength. In the narrow frame region $F_2$, the sealing material 26 is formed with the small width to correspond to a narrower frame without being restricted by the width of the sealing material 26 in the wide frame region $F_1$. As a result, a narrow-frame liquid crystal display panel 50 is obtained, which controls the finished width of the sealing material 26, and reliably provides most suitable adhesive strength in both the wide frame region $F_1$ and the narrow frame region $F_2$.

The liquid crystal display panel 50 according to this embodiment is manufactured as follows. First, in the above-described fabrication of the mother substrates, a mother substrate 60 for the TFT substrate is fabricated as in the above-described first embodiment. After that, acrylic-based resin is applied onto an entire insulating substrate 53 provided with a color filter 56 by spin coating or slit coating. The applied acrylic-based resin is exposed to light via a photomask, and then developed to be patterned. This forms the planarization film 57 including the through groove 66 in the narrow frame region $F_2$. As a result, the mother substrate 70 for the CF substrate is fabricated.

Next, as in the above-described first embodiment, the formation of the sealing material and the injection of the liquid crystal material are performed. In the injection of the liquid crystal material, the liquid crystal material is dropped in the TFT substrate 10 and the CF substrate 20. After that, in the formation of the bonded structure, the TFT substrate 10 and the CF substrate 20 are bonded together under reduced pressure such that respective display regions D overlap each other. At this time, the sealing material 26 is located in the narrow frame region $F_2$ to overlap the through groove 66 in the planarization film 57 as viewed from above.

Then, the bonded structure is exposed to atmospheric pressure to diffuse the liquid crystal material, thereby forming the liquid crystal layer 25. Heat and pressure treatment is performed under predetermined conditions (e.g., under a pressure of 2.5 MPa at a temperature of 150° C. for 30 minutes) to allow the sealing material 26 to adhere to the CF substrate 20. As a result, the TFT substrate 10 and the CF substrate 20 are bonded together via the sealing material 26.

At this time, the compression force of the planarization film 57 to the sealing material 26 in the narrow frame region $F_2$ is further reduced, since as described above, the through groove 66 overlapping the sealing material 26 has been formed in the narrow frame region $F_2$. As a result, the sealing material 26 has a small width $W_2$ in the narrow frame region $F_2$.

In the wide frame region $F_1$, the sealing material 26 has a most suitable width in the formation of the sealing material. In other words, the sealing material 26 is formed with a width sufficient to reliably provide the adhesive strength. In the narrow frame region $F_2$, the sealing material 26 is formed with the small width to correspond to a narrower frame without being restricted by the sealing material 26 in the wide frame region $F_1$.

Next, the frame regions of the bonded structure are irradiated with UV light to temporarily cure the sealing material 26, and then heated to completely cure the sealing material 26. As a result, the mother substrates 60 and 70 are bonded together to form a bonded structure 30 encapsulating a liquid crystal layer 25.

After that, the cut-out is performed as in the above-described first embodiment. Then, the liquid crystal display panel 50 shown in FIGS. 14 and 15 is manufactured.

Sixth Embodiment

Figure 16:
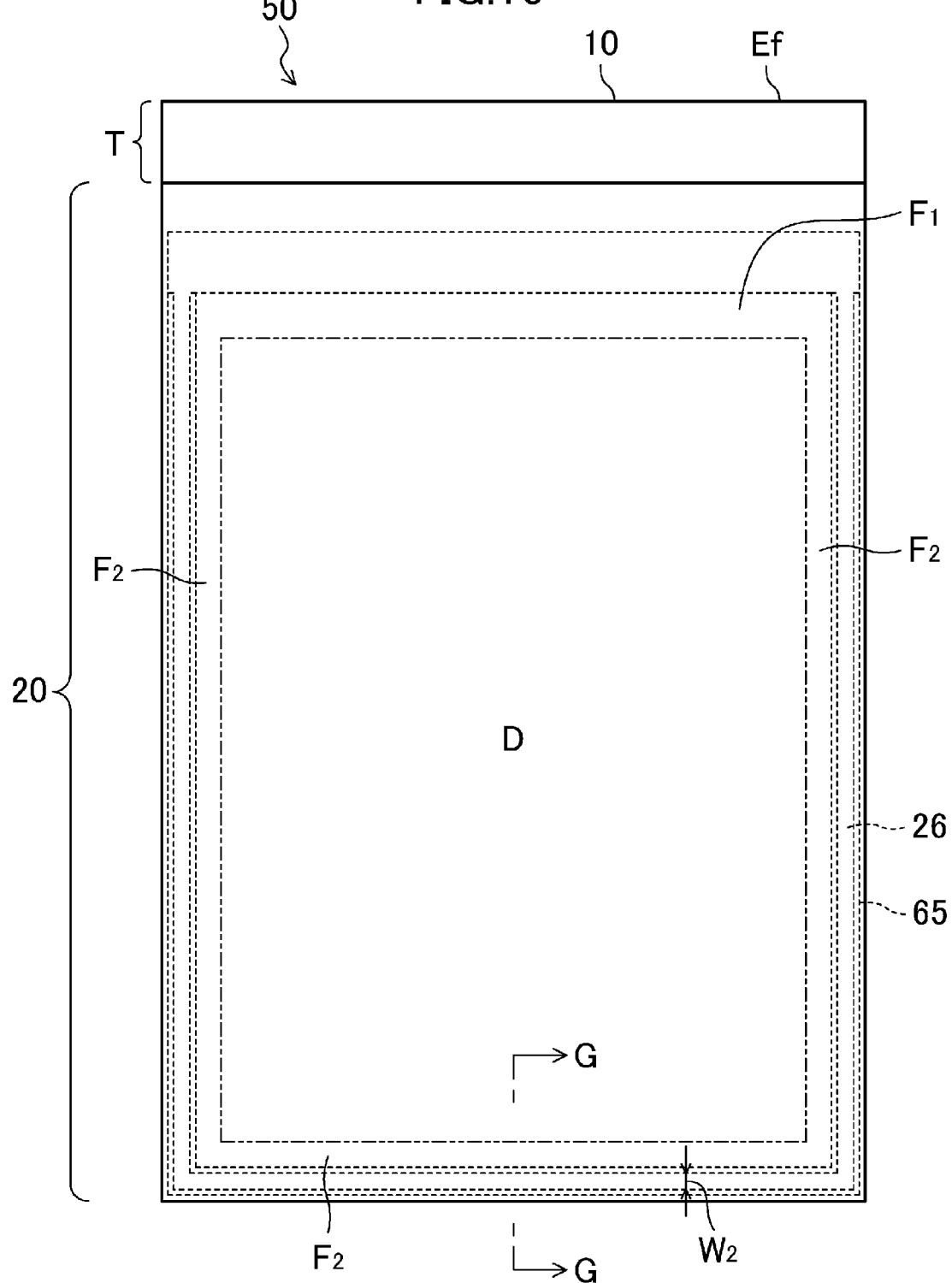
FIG. 16 is a top view of a liquid crystal display panel according to a sixth embodiment of the present invention.
Figure 17:
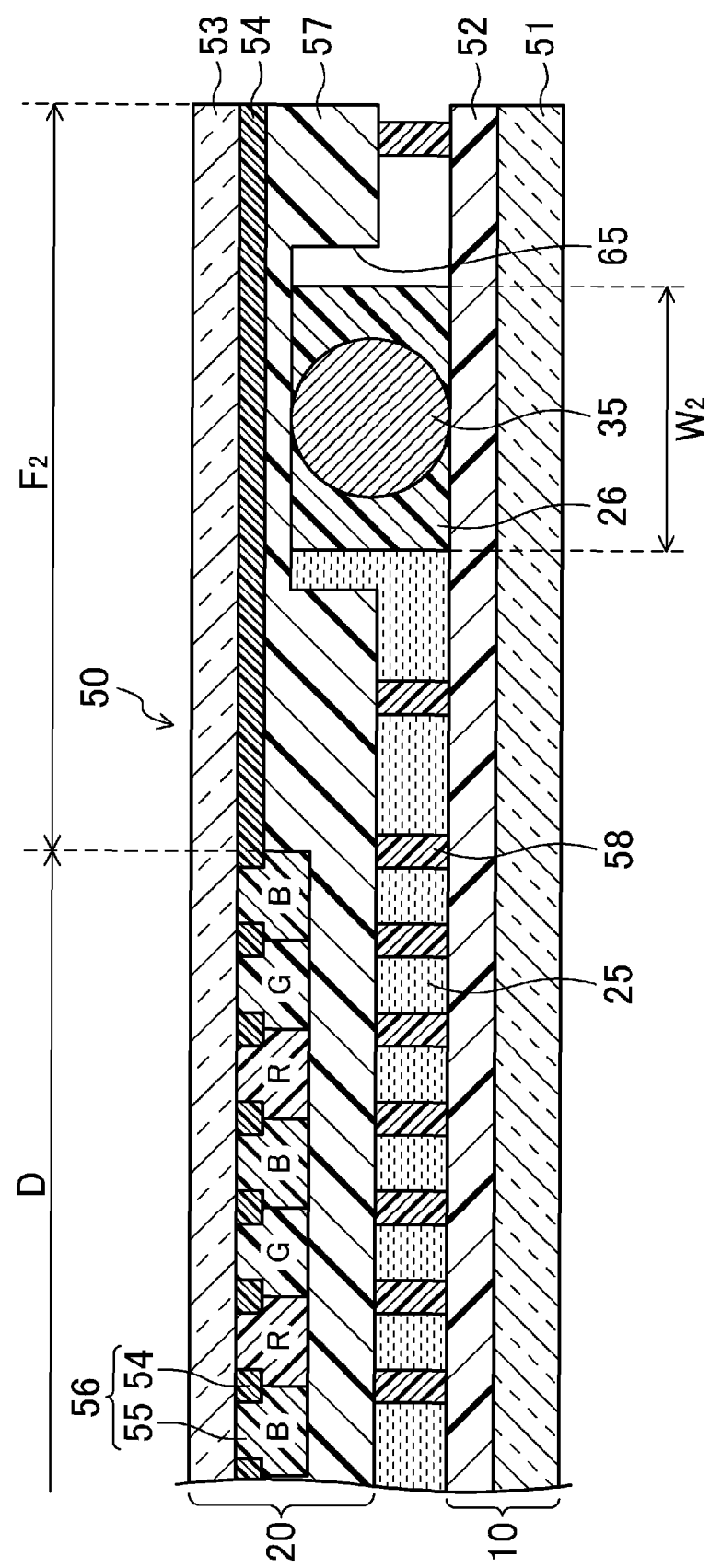
FIG. 17 is a cross-sectional view taken along the line G-G of FIG. 16.

Next, a sixth embodiment of the present invention will be described. FIG. 16 is a top view of a liquid crystal display panel according to the sixth embodiment of the present invention. FIG. 17 is cross-sectional view taken along the line G-G of FIG. 16. In this embodiment, the same reference characters as those shown in the first embodiment are used to represent equivalent elements, and the explanation thereof will be omitted. The whole structure and the manufacturing method of the liquid crystal display panel are similar to what is described in the first embodiment, and detailed explanation thereof will be omitted.

A feature of this embodiment is as follows. As shown in FIGS. 16 and 17, a recessed groove 65 overlapping the sealing material 26 as viewed from above is formed in a planarization film 57 of a CF substrate 20 in the narrow frame region $F_2$.

With this structure, the sealing material 26 in the narrow frame region $F_2$ is less compressed by the planarization film 57 in the formation of the bonded structure. As a result, the sealing material 26 has a small width $W_2$ in the narrow frame region $F_2$.

In the wide frame region $F_1$, the sealing material 26 has a most suitable width in the formation of the sealing material. In other words, the sealing material 26 is formed with a width sufficient to reliably provide the adhesive strength. In the narrow frame region $F_2$, the sealing material 26 is formed with the small width to correspond to a narrower frame without being restricted by the sealing material 26 in the wide frame region $F_1$. As a result, a narrow-frame liquid crystal display panel 50 is obtained, which controls the finished width of the sealing material 26, and reliably provides most suitable adhesive strength in both the wide frame region $F_1$ and the narrow frame region $F_2$.

In this embodiment, as shown in FIG. 17, the planarization film 57 is provided on the surface of a black matrix 54 to cover the black matrix 54 in the narrow frame region $F_2$. The planarization film 57 is located between the sealing material 26 and the black matrix 54.

As described above, in the fifth embodiment, the sealing material 26 is in contact with the black matrix 54 via the through groove 66 formed in the planarization film 57. However, the black matrix 54 has low peeling strength and is likely to peel off. Thus, when the sealing material 26 is formed on the black matrix 54, the panel may peel off due to the peeling of the black matrix 54.

On the other hand, in this embodiment, the planarization film 57 of the CF substrate 20 has the recessed groove 65 overlapping the sealing material 26 as viewed from above such that the sealing material 26 is in contact with the planarization film 57. This prevents the sealing material 26 from touching the black matrix 54, thereby preventing the panel from peeling off due to peeling of the black matrix 54.

The liquid crystal display panel 50 according to this embodiment is manufactured as follows. First, in the above-described fabrication of the mother substrates, a mother substrate 60 for the TFT substrate is fabricated as in the above-described first embodiment. After that, acrylic-based resin is applied onto an entire insulating substrate 53 provided with a color filter 56 by spin coating or slit coating. Next, a half-tone mask or a gray-tone mask is used to control the amount of exposure. The acrylic-based resin is exposed to the controlled light, and then developed to pattern tens of percent of the thickness. This forms the planarization film 57 having the recessed groove 65 in the narrow frame region $F_2$. As a result, a mother substrate 70 for the CF substrate is fabricated.

The amount of exposure is controlled, for example, by setting the aperture ratio (or transmittance) of the mask to be used to 50% so that the thickness of the planarization film 57 in the narrow frame region $F_2$ is about half the thickness of the planarization film 57 in a display region D.

Next, as in the above-described first embodiment, the formation of the sealing material and the injection of the liquid crystal material are performed. In the injection of the liquid crystal material, the liquid crystal material is dropped in the TFT substrate 10 and the CF substrate 20. After that, in the formation of the bonded structure, the TFT substrate 10 and the CF substrate 20 are bonded together under reduced pressure such that respective display regions D overlap each other. At this time, the sealing material 26 is located in the narrow frame region $F_2$ to overlap the recessed groove 65 in the planarization film 57 as viewed from above.

Then, the bonded structure is exposed to atmospheric pressure to diffuse the liquid crystal material, thereby forming the liquid crystal layer 25. Heat and pressure treatment is performed under predetermined conditions (e.g., under a pressure of 2.5 MPa at a temperature of 150° C. for 30 minutes) to allow the sealing material 26 to adhere to the CF substrate 20. That is, the TFT substrate 10 and the CF substrate 20 are bonded together via the sealing material 26.

At this time, the sealing material 26 in the narrow frame region $F_2$ is less compressed by the planarization film 57, since as described above, the recessed groove 65 overlapping the sealing material 26 has been formed in the narrow frame region $F_2$. As a result, the sealing material 26 has a small width $W_2$ in the narrow frame region $F_2$.

Next, the frame regions of the bonded structure are irradiated with UV light to temporarily cure the sealing material 26, and then heated to completely cure the sealing material 26. As a result, the mother substrates 60 and 70 are bonded together to form a bonded structure 30 encapsulating a liquid crystal layer 25.

After that, the cut-out is performed as in the above-described first embodiment. Then, the liquid crystal display panel 50 shown in FIGS. 16 and 17 is manufactured.

Seventh Embodiment

Figure 18:
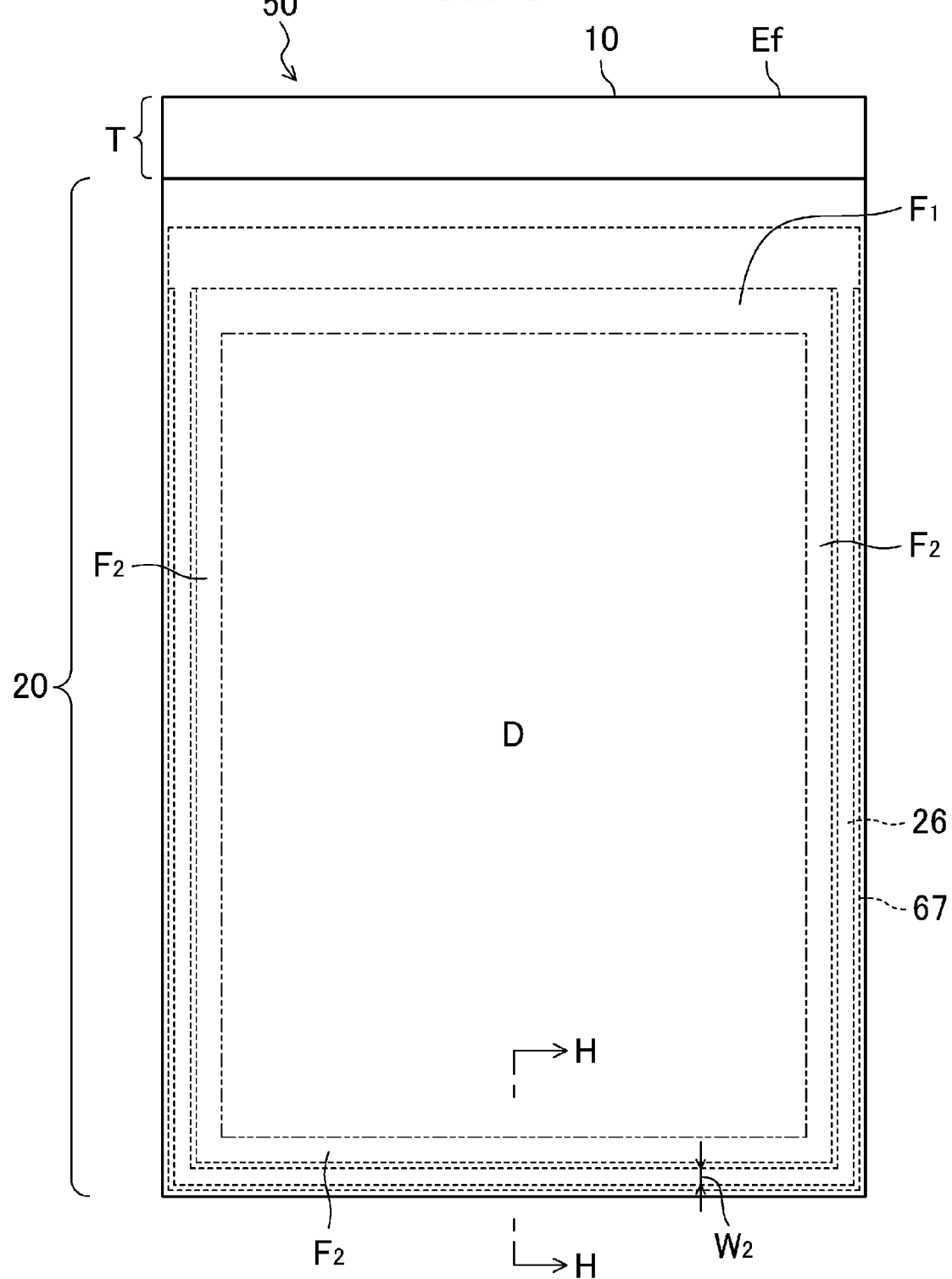
FIG. 18 is a top view of a liquid crystal display panel according to a seventh embodiment of the present invention.
Figure 19:
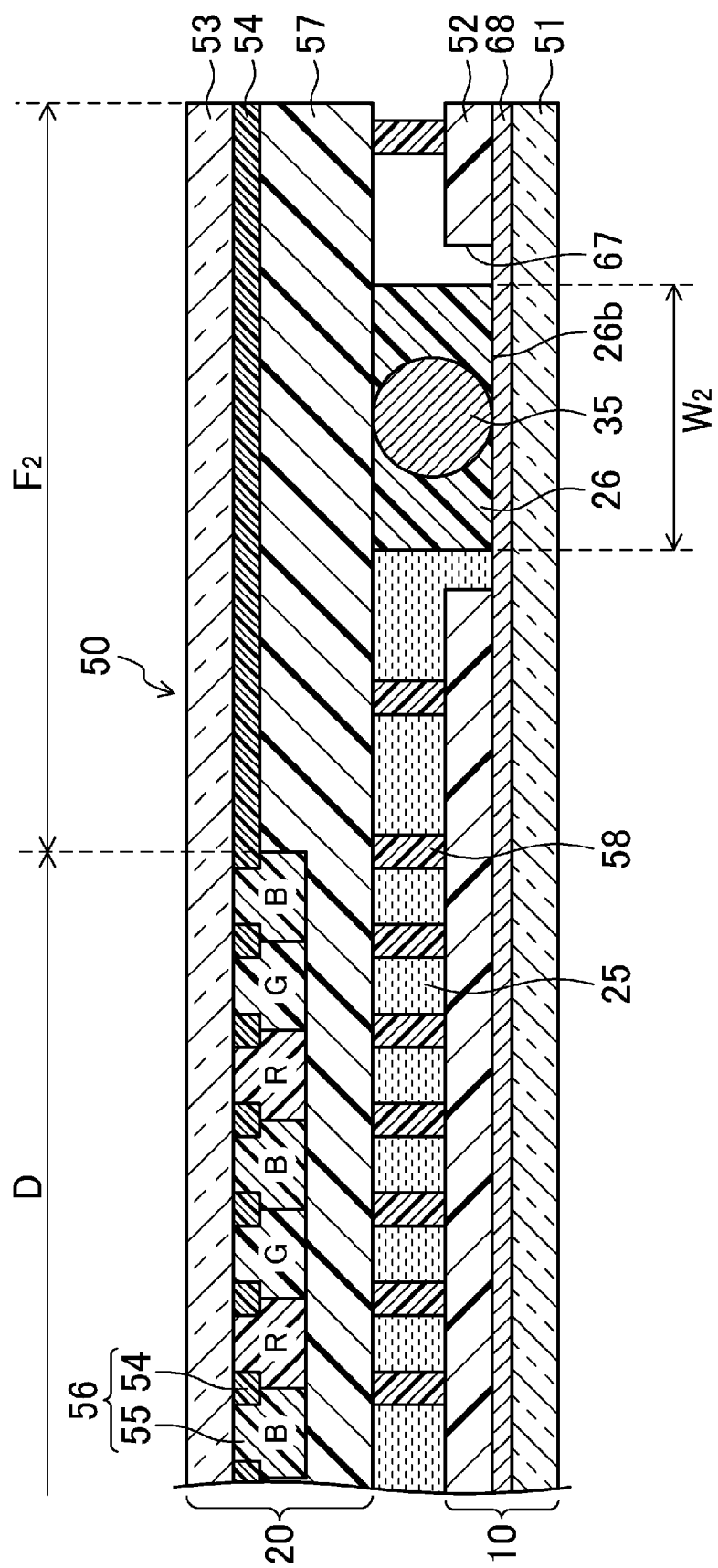
FIG. 19 is a cross-sectional view taken along the line H-H of FIG. 18.

Next, a seventh embodiment of the present invention will be described. FIG. 18 is a top view of a liquid crystal display panel according to the seventh embodiment of the present invention. FIG. 19 is a cross-sectional view taken along the line H-H of FIG. 18. In this embodiment, the same reference characters as those shown in the first embodiment are used to represent equivalent elements, and the explanation thereof will be omitted. The whole structure and the manufacturing method of the liquid crystal display panel are similar to what is described in the first embodiment, and detailed explanation thereof will be omitted.

A feature of this embodiment is as follows. As shown in FIGS. 18 and 19, a through groove 67 overlapping the sealing material 26 as viewed from above is formed in a planarization film 52 of a TFT substrate 10 in a narrow frame region $F_2$.

More specifically, as shown in FIG. 19, an insulating film 68 is formed on an insulating substrate 51 of the TFT substrate 10. The planarization film 52 has a through groove 67 in the narrow frame region $F_2$. Via this through groove 67, the sealing material 26 (i.e., an entire surface 26b of the sealing material 26 in the TFT substrate 10) is in contact with the insulating film 68. The planarization film 52 is divided by the through groove 67.

This insulating film 68 aims to prevent driver circuits (i.e., a gate driver driving gate lines in a display region D or a source driver driving source lines in the display region D) provided in the narrow frame region $F_2$ (i.e., a driver circuit region) from coming in contact with the sealing material 26 to be damaged. The insulating film 68 also aims to prevent the driver circuits exposed from the through groove 67 from corroding.

In this embodiment, this structure further reduces the compression force of the planarization film 52 to the sealing material 26 in the narrow frame region $F_2$ in the formation of the bonded structure. As a result, the sealing material 26 has a small width $W_2$ in the narrow frame region $F_2$.

In the wide frame region $F_1$, the sealing material 26 has a most suitable width in the formation of the sealing material. In other words, the sealing material 26 is formed with a width sufficient to reliably provide the adhesive strength. In the narrow frame region $F_2$, the sealing material 26 is formed with the small width to correspond to a narrower frame without being restricted by the sealing material 26 in the wide frame region $F_1$. As a result, a narrow-frame liquid crystal display panel 50 is obtained, which controls the finished width of the sealing material 26, and reliably provides most suitable adhesive strength in both the wide frame region $F_1$ and the narrow frame region $F_2$.

The liquid crystal display panel 50 according to this embodiment is manufactured as follows. First, in the above-described fabrication of the mother substrates, for example, a silicon nitride film is formed on the entire insulating substrate 51 by plasma CVD to form the insulating film 68. Then, acrylic-based resin is applied onto the entire insulating substrate 51 provided with the insulating film 68 by spin coating or slit coating. The applied acrylic-based resin is exposed to light via a photomask, and then developed to be patterned. This forms the planarization film 52 having the through groove 67 in the narrow frame region $F_2$. As a result, a mother substrate 60 for the TFT substrate is fabricated.

Next, as in the above-described first embodiment, the mother substrate 60 for the TFT substrate is fabricated, and the formation of the sealing material and the injection of the liquid crystal material are performed. In the injection of the liquid crystal material, the liquid crystal material is dropped in the TFT substrate 10 and the CF substrate 20. After that, in the formation of the bonded structure, the TFT substrate 10 and the CF substrate 20 are bonded together under reduced pressure such that the display regions D overlap each other. At this time, the sealing material 26 is located in the narrow frame region $F_2$ to overlap the through groove 67 in the planarization film 52 as viewed from above.

Then, the bonded structure is exposed to atmospheric pressure to diffuse the liquid crystal material, thereby forming the liquid crystal layer 25. Heat and pressure treatment is performed under predetermined conditions (e.g., under a pressure of 2.5 MPa at a temperature of 150° C. for 30 minutes) to allow the sealing material 26 to adhere to the CF substrate 20. As a result, the TFT substrate 10 and the CF substrate 20 are bonded together via the sealing material 26.

At this time, the compression force of the planarization film 52 to the sealing material 26 in the narrow frame region $F_2$ is further reduced, since as described above, the through groove 67 overlapping the sealing material 26 has been formed in the narrow frame region $F_2$. As a result, the sealing material 26 has a small width $W_2$ in the narrow frame region $F_2$.

Next, the frame regions of the bonded structure are irradiated with UV light to temporarily cure the sealing material 26, and then heated to completely cure the sealing material 26. As a result, the mother substrates 60 and 70 are bonded together to form a bonded structure 30 encapsulating the liquid crystal layer 25.

After that, the cut-out is performed as in the above-described first embodiment. Then, the liquid crystal display panel 50 shown in FIGS. 18 and 19 is manufactured.

Eighth Embodiment

Figure 20:
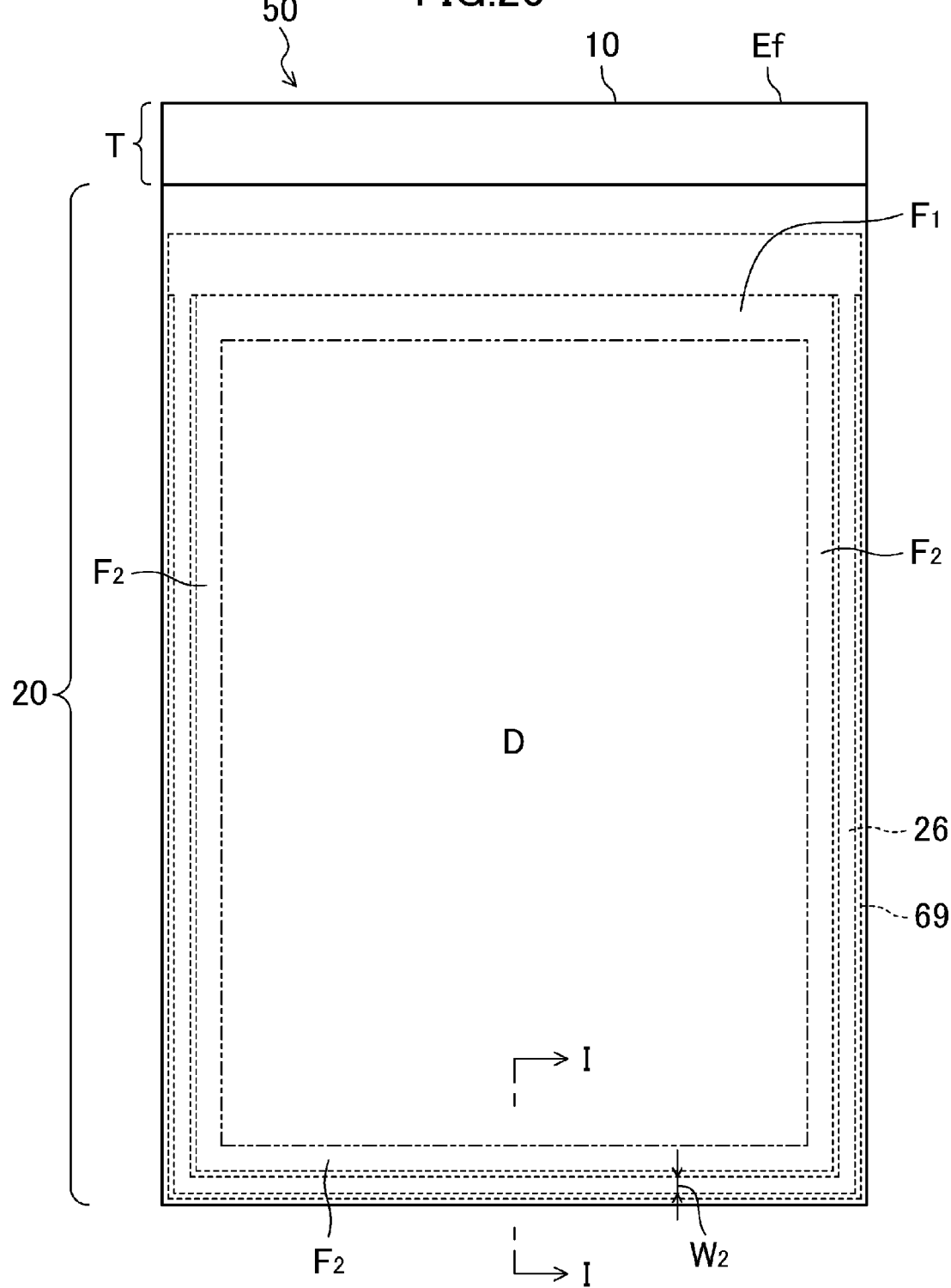
FIG. 20 is a top view of a liquid crystal display panel according to an eighth embodiment of the present invention.
Figure 21:
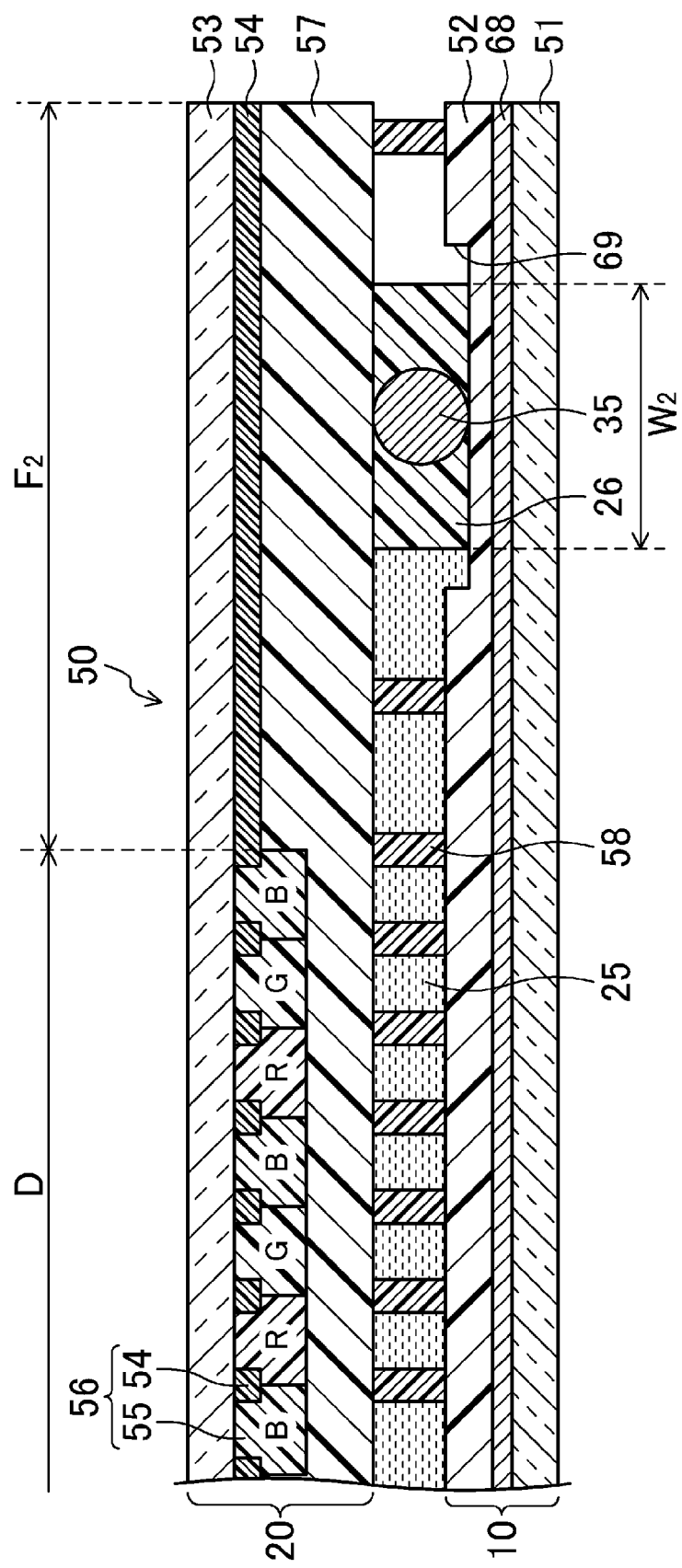
FIG. 21 is a cross-sectional view taken along the line I-I of FIG. 20.

Next, an eighth embodiment of the present invention will be described. FIG. 20 is a top view of a liquid crystal display panel according to the eighth embodiment of the present invention. FIG. 21 is a cross-sectional view taken along the line I-I of FIG. 20. In this embodiment, the same reference characters as those shown in the first embodiment are used to represent equivalent elements, and the explanation thereof will be omitted. The whole structure and the manufacturing method of the liquid crystal display panel are similar to what is described in the first embodiment, and detailed explanation thereof will be omitted.

A feature of this embodiment is as follows. As shown in FIGS. 20 and 21, a recessed groove 69 overlapping the sealing material 26 as viewed from above is formed in a planarization film 52 of a TFT substrate 10 in the narrow frame region $F_2$.

More specifically, in the narrow frame region $F_2$, the planarization film 52 is provided on the surface of the insulating film 68 to cover the insulating film 68. The recessed groove 69 is located between the sealing material 26 and the insulating film 68.

With this structure, the sealing material 26 in the narrow frame region $F_2$ is less compressed by the planarization film 52 in the formation of the bonded structure. As a result, the sealing material 26 has a small width $W_2$ in the narrow frame region $F_2$.

In the wide frame region $F_1$, the sealing material 26 has a most suitable width in the formation of the sealing material. In other words, the sealing material 26 is formed with a width sufficient to reliably provide the adhesive strength. In the narrow frame region $F_2$, the sealing material 26 is formed with the small width to correspond to a narrower frame without being restricted by the sealing material 26 in the wide frame region $F_1$. As a result, a narrow-frame liquid crystal display panel 50 is obtained, which controls the finished width of the sealing material 26, and reliably provides most suitable adhesive strength in both the wide frame region $F_1$ and the narrow frame region $F_2$.

The liquid crystal display panel 50 according to this embodiment is manufactured as follows. First, in the above-described fabrication of the mother substrates, acrylic-based resin is applied onto the entire insulating substrate 51 provided with the insulating film 68 by spin coating or slit coating. Next, a half-tone mask or a gray-tone mask is used to control the amount of exposure. The applied acrylic-based resin is exposed to the controlled light, and then developed to pattern tens of percent of the thickness. This forms the planarization film 52 having the recessed groove 69 in the narrow frame region $F_2$. As a result, a mother substrate 60 for the TFT substrate is fabricated.

The amount of exposure is controlled, for example, by setting the aperture ratio (or transmittance) of the mask to be used to 50% so that the thickness of the planarization film 52 in the narrow frame region $F_2$ is about half the thickness of the planarization film 52 in a display region D.

Next, as in the above-described first embodiment, the mother substrate 70 for the CF substrate is fabricated. Then, as in the above-described first embodiment, the formation of the sealing material, and the injection of the liquid crystal material are performed. In the injection of the liquid crystal material, the liquid crystal material is dropped in the TFT substrate 10 and the CF substrate 20. After that, in the formation of the bonded structure, the TFT substrate 10 and the CF substrate 20 are bonded together under reduced pressure such that respective display regions D overlap each other. At this time, the sealing material 26 is located in the narrow frame region $F_2$ to overlap the recessed groove 69 of the planarization film 52 as viewed from above.

Then, the bonded structure is exposed to atmospheric pressure to diffuse the liquid crystal material, thereby forming the liquid crystal layer 25. Heat and pressure treatment is performed under predetermined conditions (e.g., under a pressure of 2.5 MPa at a temperature of 150° C. for 30 minutes) to allow the sealing material 26 to adhere to the CF substrate 20. As a result, the TFT substrate 10 and the CF substrate 20 are bonded together via the sealing material 26.

At this time, the sealing material 26 in the narrow frame region $F_2$ is less compressed by the planarization film 52, since as described above, the recessed groove 69 overlapping the sealing material 26 has been formed in the narrow frame region $F_2$. As a result, the sealing material 26 has a small width $W_2$ in the narrow frame region $F_2$.

Next, the frame regions of the bonded structure are irradiated with UV light to temporarily cure the sealing material 26, and then heated to completely cure the sealing material 26. As a result, the mother substrates 60 and 70 are bonded together to form a bonded structure 30 encapsulating the liquid crystal layer 25.

After that, the cut-out is performed as in the above-described first embodiment. Then, the liquid crystal display panel 50 shown in FIGS. 20 and 21 is manufactured.

The above-described embodiments may be modified as follows.

In the above-described first and second embodiments, the dummy structure 2 in the wide frame region $F_1$ is made of the same material as the color layer 28, for example, acrylic-based photosensitive resin. Alternatively, for example, a transparent layer made of acrylic-based photosensitive resin may be provided on the above-described color filter 56. The dummy structure may be made of the same material as this transparent layer.

In this case, the acrylic-based photosensitive resin is applied onto the entire substrate of the CF substrate 20 including the color filter 56 etc., by spin coating or slit coating. The applied photosensitive resin is exposed to light via a photomask, and then developed to form the transparent layer and the dummy structure 2 at the same time.

Alternatively, in the wide frame region $F_1$, the dummy structure 2 may be provided on the surface of the black matrix 54 of the CF substrate 20. The planarization film 57 may cover the dummy structure 2. The dummy structure 4 may be provided on the surface of the planarization film 52 of the TFT substrate 10. The sealing material 26 may cover the dummy structure 4.

In short, in the present invention, a dummy structure overlapping the sealing material 26 as viewed from above may be provided in at least one of the TFT substrate 10 or the CF substrate 20 in the wide frame region $F_1$.

Figure 22:
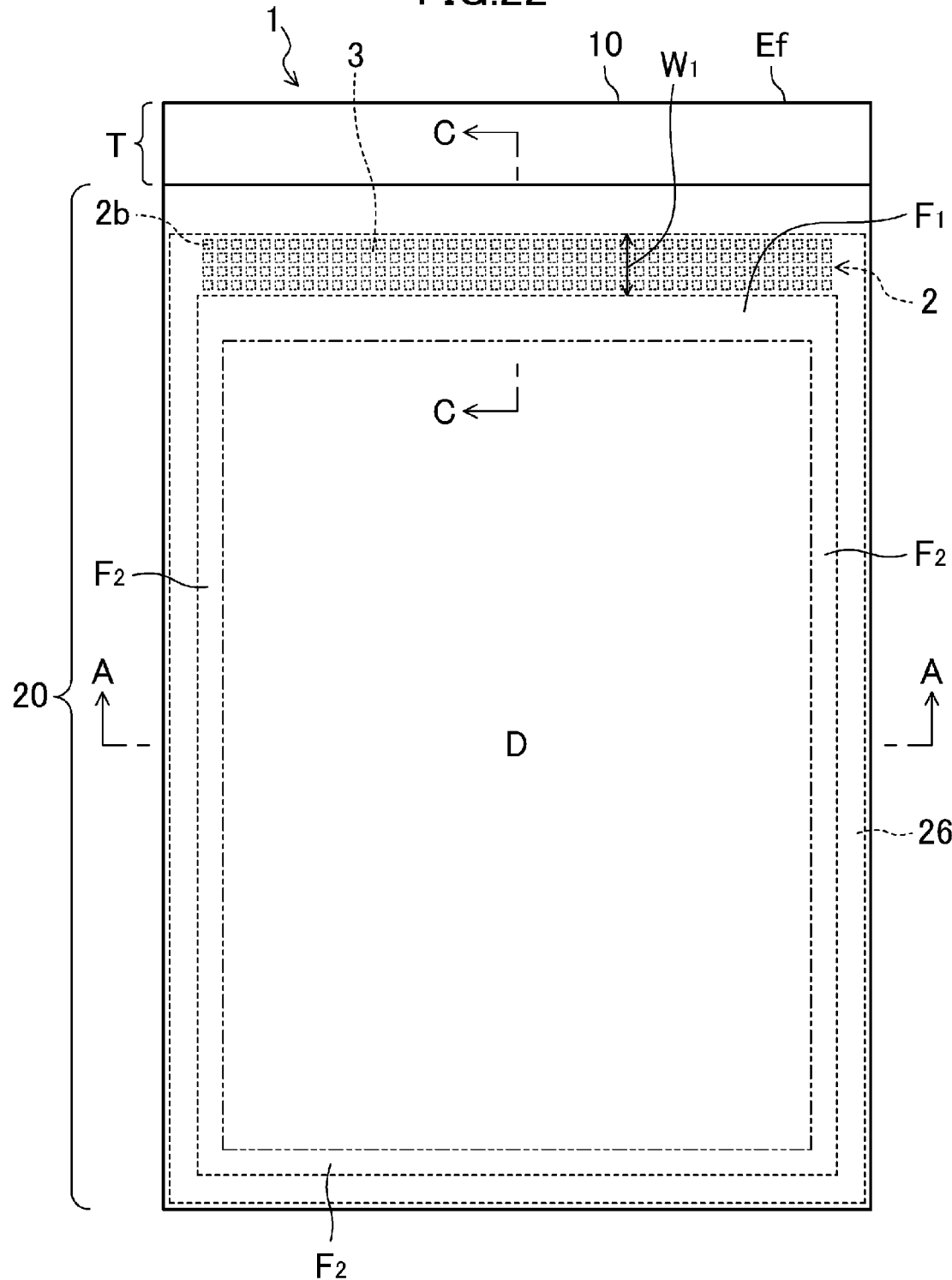
FIG. 22 is a top view of a liquid crystal display panel according to a variation of the present invention.

In the second embodiment, the dummy structure 2 includes the plurality of linear dummy structures 2a. These linear dummy structures 2a are spaced apart from each other at the predetermined intervals to interpose one of the through grooves 3 between each pair of the linear dummy structures 2a. Alternatively, as shown in FIG. 22, the dummy structure 2 may include a plurality of dot dummy structures 2b. These dot dummy structures 2b are spaced apart from each other at predetermined intervals to provide the through grooves 3.

In this case, as compared to the case where the dummy structure 2 includes the linear dummy structures 2a shown in FIG. 8, the total area of the through grooves 3 is large. This further increases the contact area between the planarization film 57 covering the dummy structure 2 and the black matrix 54. As a result, the dummy structure 2 on the black matrix 54 is further prevented from peeling off the black matrix 54.

In the fifth embodiment, as shown in FIG. 15, the entire surface 26a of the sealing material 26 in the CF substrate 20 is in contact with the black matrix 54 via the through groove 66 formed in the planarization film 57. Alternatively, as shown in FIG. 23, the width $W_3$ of the through groove 66 is set smaller than the width $W_2$ of the sealing material 26 (i.e., $W_2 > W_3$) so that part of the surface 26a of the sealing material 26 in the CF substrate 20 is in contact with the black matrix 54 via the through groove 66 formed in the planarization film 57.

Similarly, in the seventh embodiment, as shown in FIG. 19, the entire surface 26b of the sealing material 26 in the TFT substrate 10 is in contact with the insulating film 68 via the through groove 67 formed in the planarization film 52. Alternatively, as shown in FIG. 24, the width $W_4$ of the through groove 67 is set smaller than the width $W_2$ of the sealing material 26 (i.e., $W_2 > W_4$) so that part of the surface 26b of the sealing material 26 in the CF substrate 20 is in contact with the insulating film 68 via the through groove 67 formed in the planarization film 52.

Figure 23:
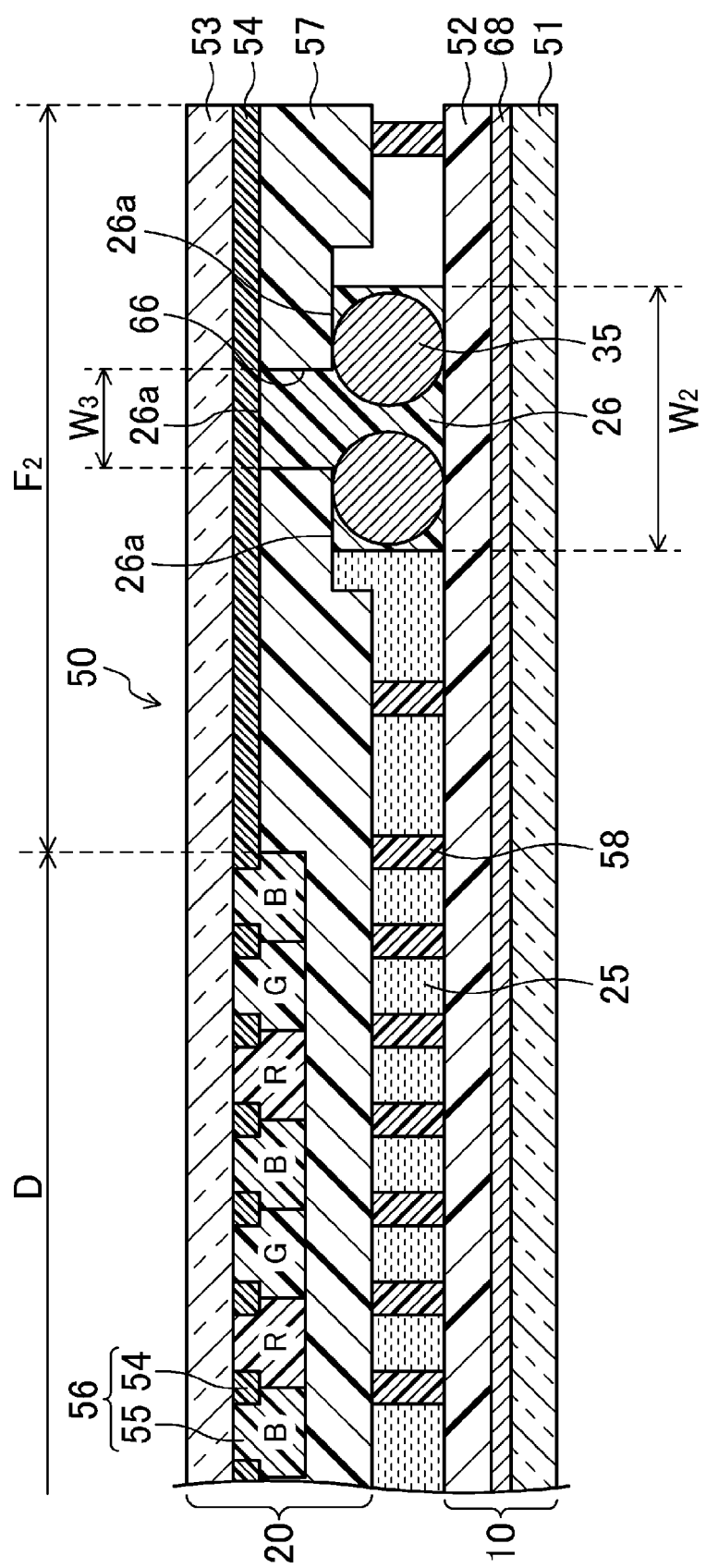
FIG. 23 is a cross-sectional view of a liquid crystal display panel according to another variation of the present invention.
Figure 24:
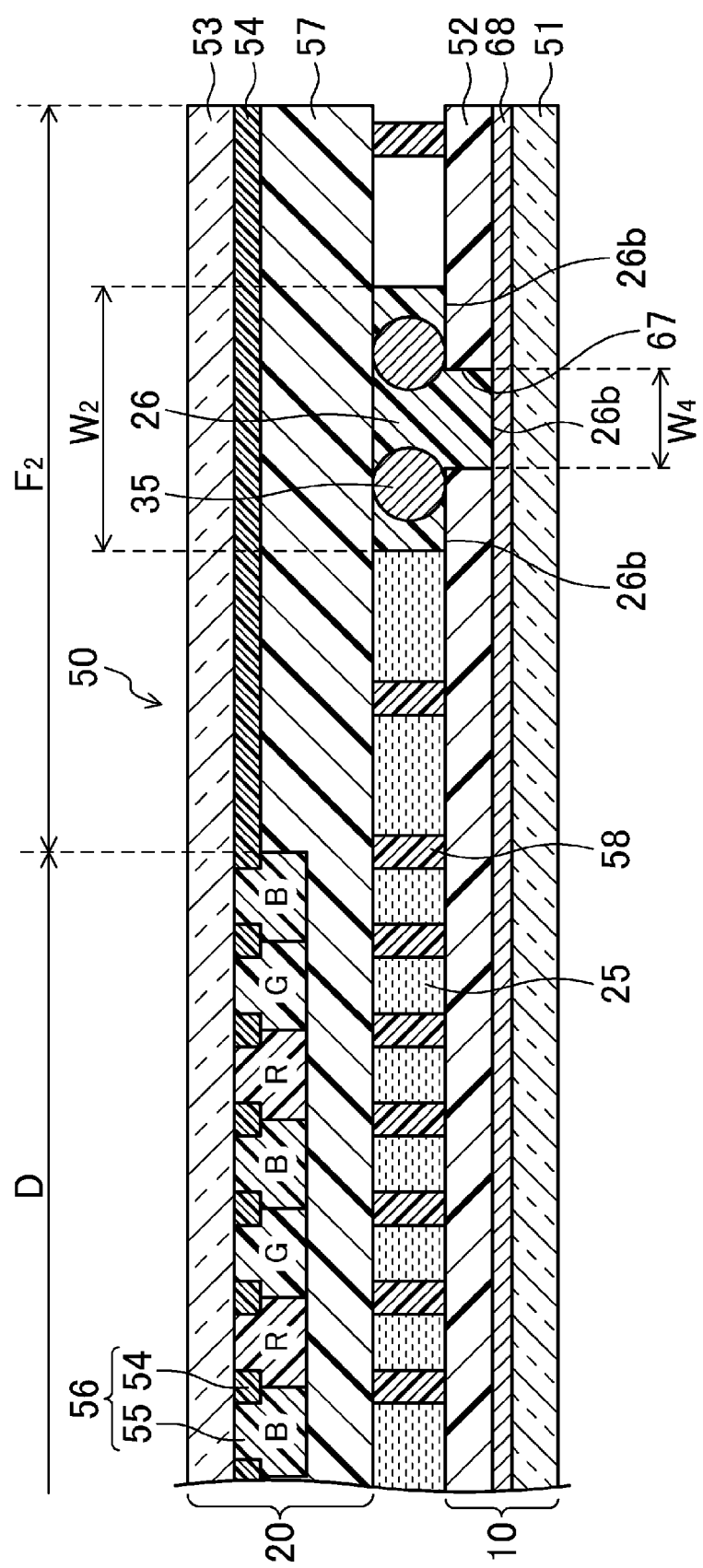
FIG. 24 is a cross-sectional view of a liquid crystal display panel according to still another variation of the present invention.

This structure provides spacers 35 inside the sealing material 26 except the through grooves 66 and 67 as shown in FIGS. 23 and 24, respectively. Thus, as compared to the cases shown in FIGS. 15 and 19, the total area of the spacers 35 is large. As a result, even when the through grooves 66 and 67 are formed, the distance between the planarization films 52 and 57 in the narrow frame region $F_2$ is controlled to be equal to the distance between the planarization films 52 and 57 in the wide frame region $F_1$.

In the structure shown in FIG. 23, the width $W_3$ of the through groove 66 is set smaller than the width $W_2$ of the sealing material 26 (i.e., $W_2 > W_3$) so that the sealing material 26 includes the through groove 66 in its inside. This increases the stress-bearing surface of the sealing material 26 at the end to disperse the stress. As a result, the black matrix 54 is prevented from peeling off.

Similarly, in the structure shown in FIG. 24, the width $W_4$ of the through groove 67 is set smaller than the width $W_2$ of the sealing material 26 (i.e., $W_2 > W_4$) so that the sealing material 26 includes the through groove 67 in its inside. This increases the stress-bearing surface of the sealing material 26 at the end to disperse the stress. As a result, the insulating film 68 is prevented from peeling off.

Figure 25:
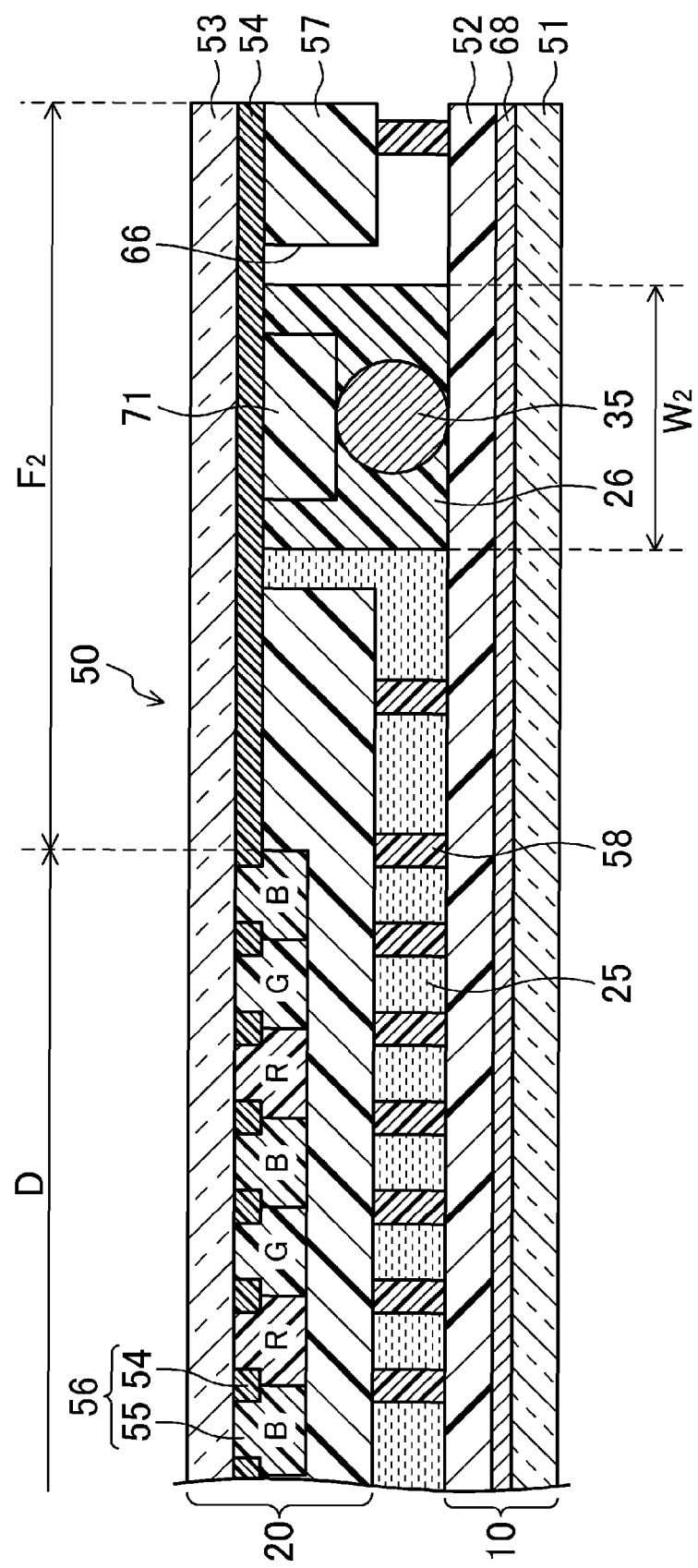
FIG. 25 is a cross-sectional view of a liquid crystal display panel according to yet another variation of the present invention.

In the above-described fifth embodiment shown in FIG. 15, a step member 71 made of the planarization film 57 may be provided inside the through groove 66 in the narrow frame region $F_2$ as shown in FIG. 25. The sealing material 26 may cover this step member 71. In this case, the step member 71 is provided on the surface of the black matrix 54. The sealing material 26 is provided on the surface of the black matrix 54 to cover the step member 71.

Figure 26:
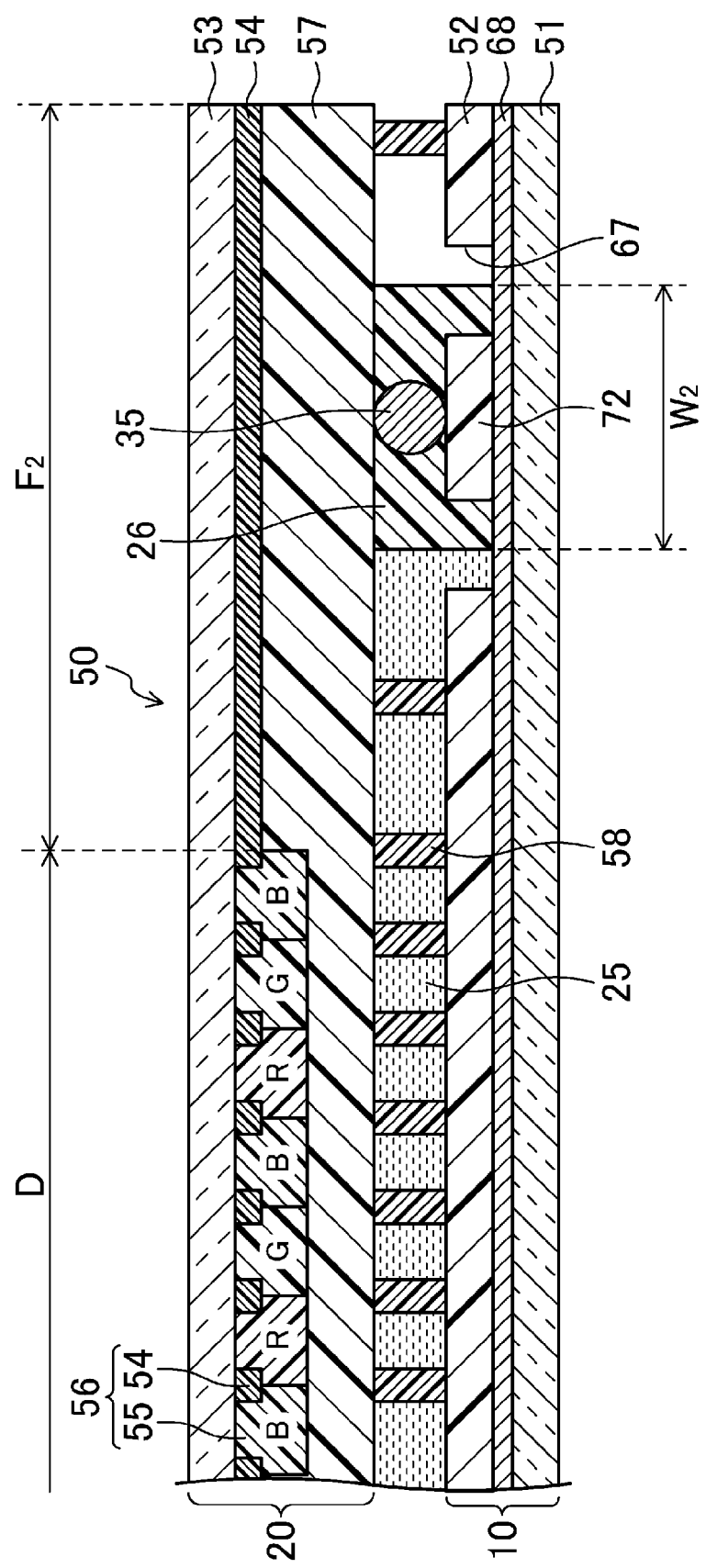
FIG. 26 is a cross-sectional view of a liquid crystal display panel according to further another variation of the present invention.

Similarly, in the seventh embodiment shown in FIG. 19, a step member 72 made of the planarization film 52 may be provided inside the through groove 67 in the narrow frame region $F_2$ as shown in FIG. 26. The sealing material 26 may cover the step member 72. In this case, the step member 72 is provided on the surface of the insulating film 68. The sealing material 26 provided on the surface of the insulating film 68 to cover the step member 72.

In these structures, the step member 71 or 72 serving as a reference of the cell gap is provided in the narrow frame region $F_2$ including the sealing material 26, thereby facilitating the control of the cell gap in the narrow frame region $F_2$.

Figure 27:
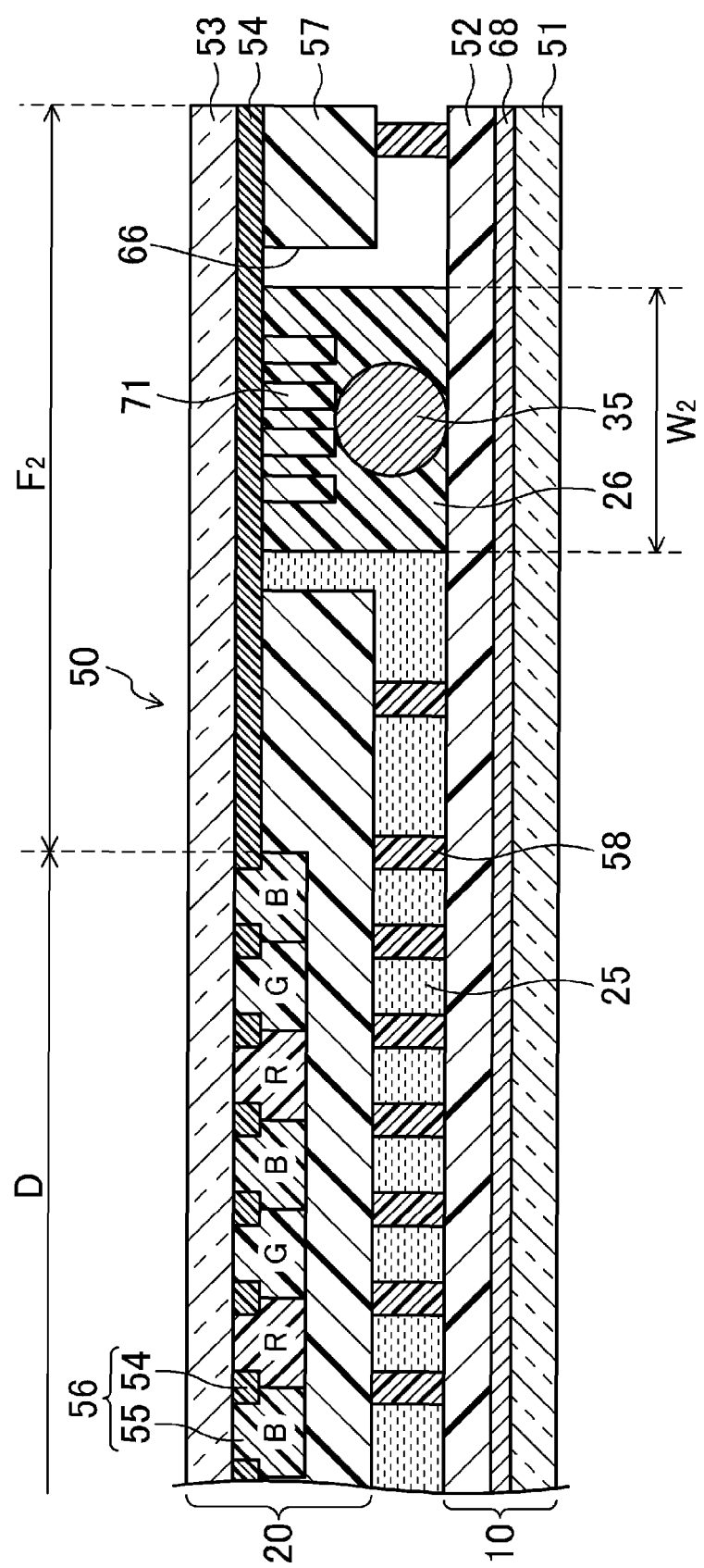
FIG. 27 is a cross-sectional view of a liquid crystal display panel according to even another variation of the present invention.

As shown in FIG. 27, a plurality of (four in FIG. 27) step members 71 are spaced apart from each other at predetermined intervals.

As compared to the structure shown in FIG. 25, this structure provides a large contact area between the sealing material 26 and the step member 71, and a large contact area between the sealing material 26 and the black matrix 54. As a result, the adhesive strength of the sealing material 26 improves. Tens of step members 71 may be provided.

Figure 28:
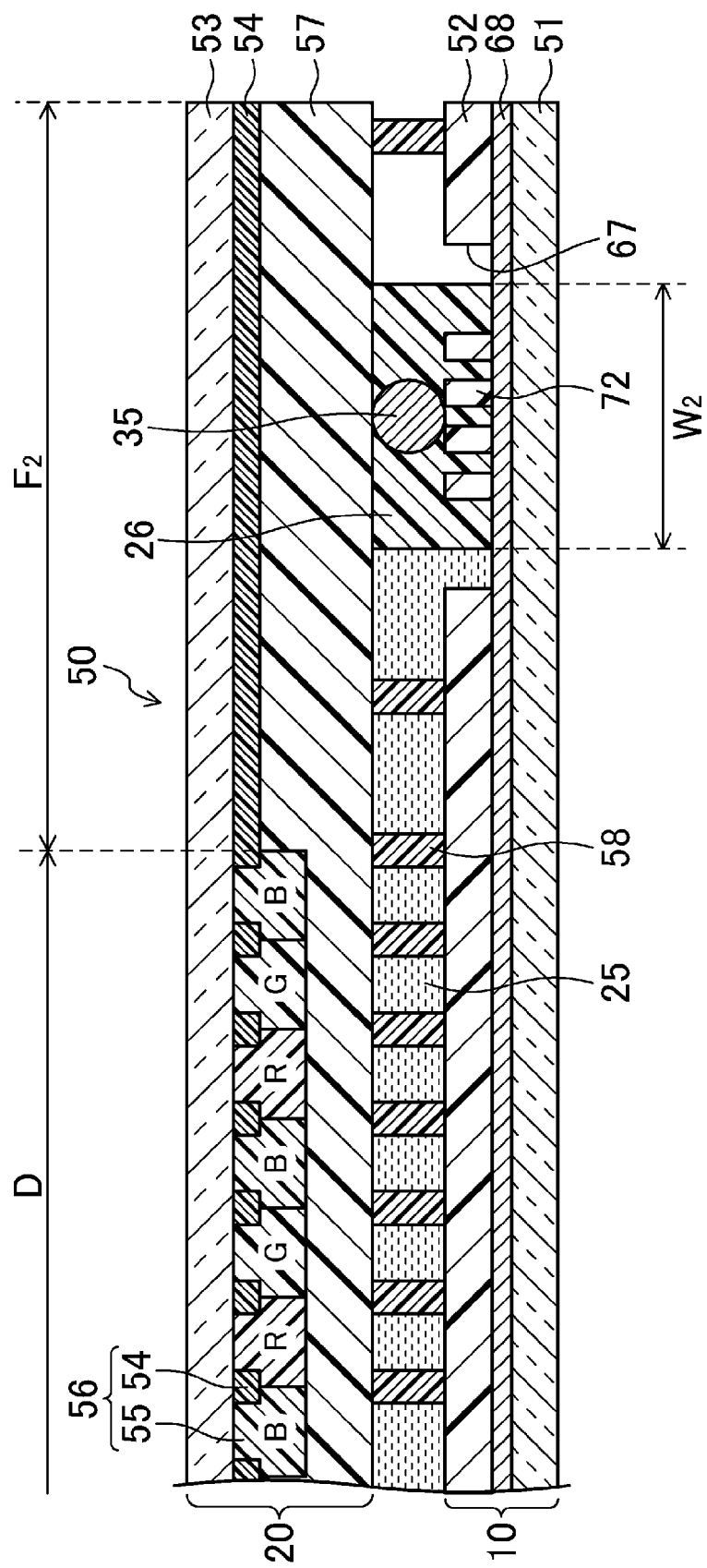
FIG. 28 is a cross-sectional view of a liquid crystal display panel according to even further variation of the present invention.

Similarly, as shown in FIG. 28, a plurality of (four in FIG. 28) step members 72 are spaced apart from each other at predetermined intervals.

As compared to the structure shown in FIG. 26, this structure provides a large contact area between the sealing material 26 and the step member 72, and a large contact area between the sealing material 26 and the insulating film 68. The step member 72 is prevented from peeling off the insulating film 68 with high peeling strength. Tens of step members 72 may be provided.

The structures shown in FIG. 27 and FIG. 28 increase the above-described bonding area, even if the sealing material 26 has a small width (i.e., the sealing material 26 is thin).

Figure 29:
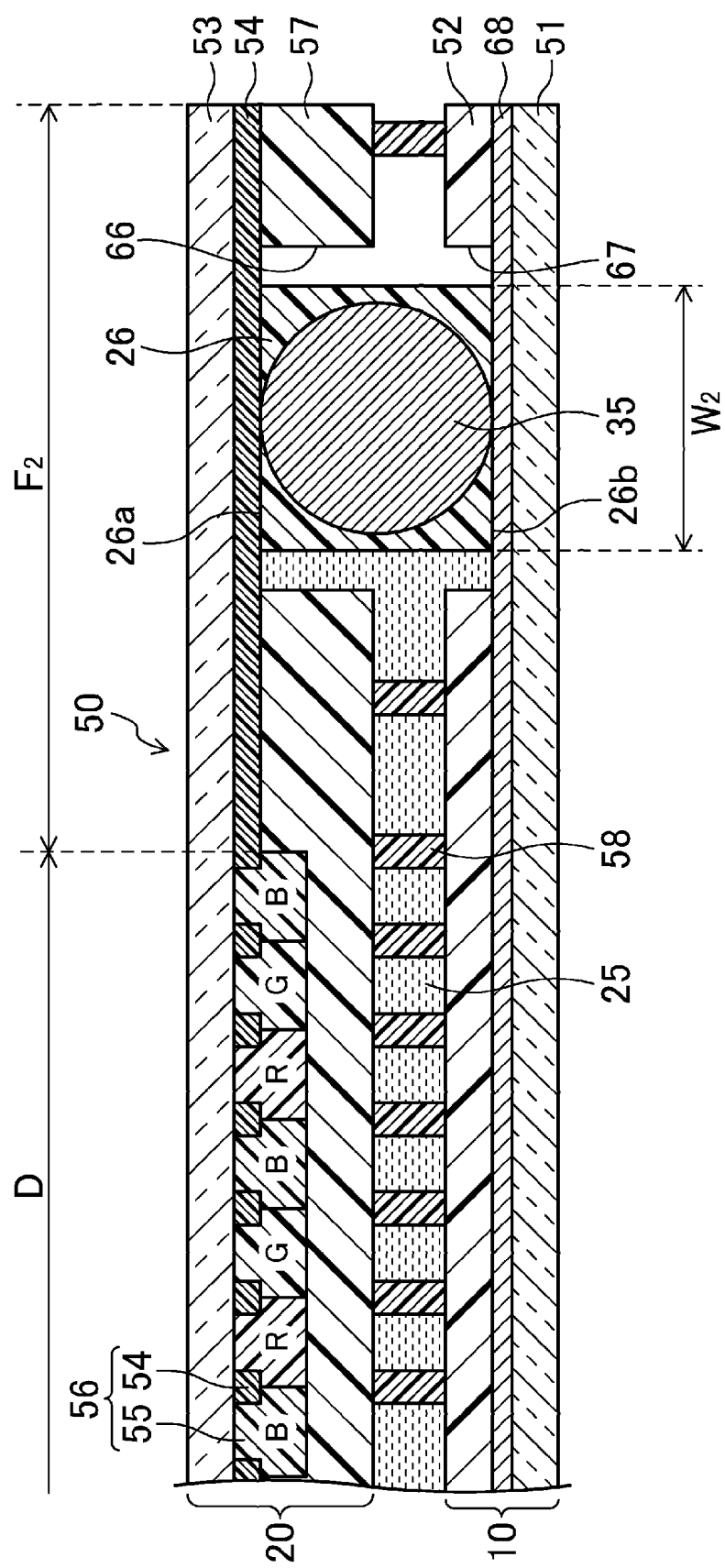
FIG. 29 is a cross-sectional view of a liquid crystal display panel according to yet further variation of the present invention.

As shown in FIG. 29, in the narrow frame region $F_2$, a planarization film 57 of a CF substrate 20 has a through groove 66 overlapping the sealing material 26 as viewed from above. A planarization film 52 of a TFT substrate 10 may have a through groove 67 overlapping the sealing material 26 as viewed from above.

In short, in the present invention, a through groove overlapping the sealing material 26 as viewed from above may be provided in at least one of the TFT substrate 10 or the CF substrate 20 in the narrow frame region $F_2$.

Figure 30:
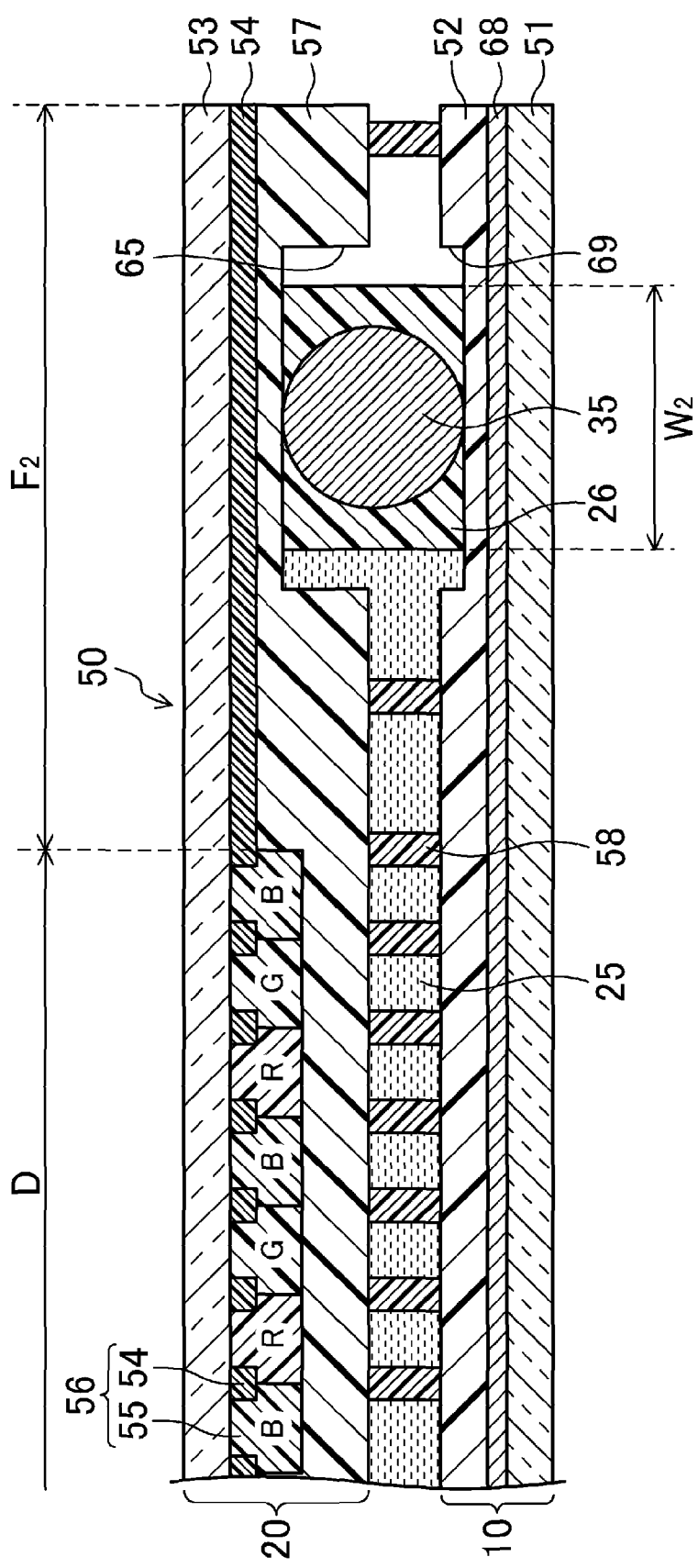
FIG. 30 is a cross-sectional view of a liquid crystal display panel according to still further variation of the present invention.

As shown in FIG. 30, in the narrow frame region $F_2$, a planarization film 57 of a CF substrate 20 has a recessed groove 65 overlapping the sealing material 26 as viewed from above. A planarization film 52 of a TFT substrate 10 may have a recessed groove 69 overlapping the sealing material 26 as viewed from above.

In short, in the present invention, a recessed groove overlapping the sealing material 26 as viewed from above may be provided in at least one of the TFT substrate 10 or the CF substrate 20 in the narrow frame region $F_2$.

While in the above-described embodiments, an example has been described where the display panel is the liquid crystal display panel 1, the present invention is also used to other display panels such as organic EL display panels.

Figure 31:
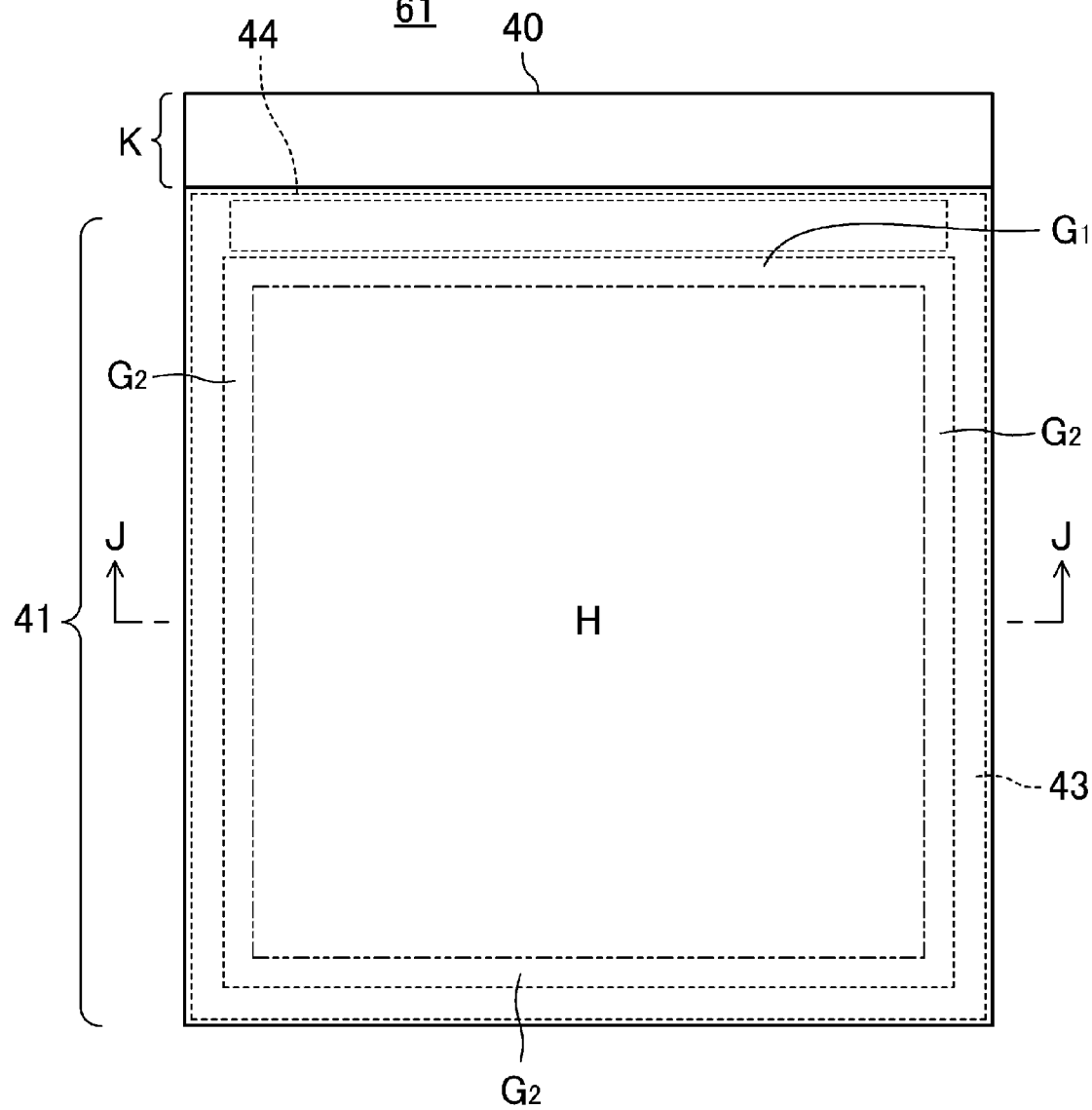
FIG. 31 is a top view of an organic EL display device according to a variation.
Figure 32:
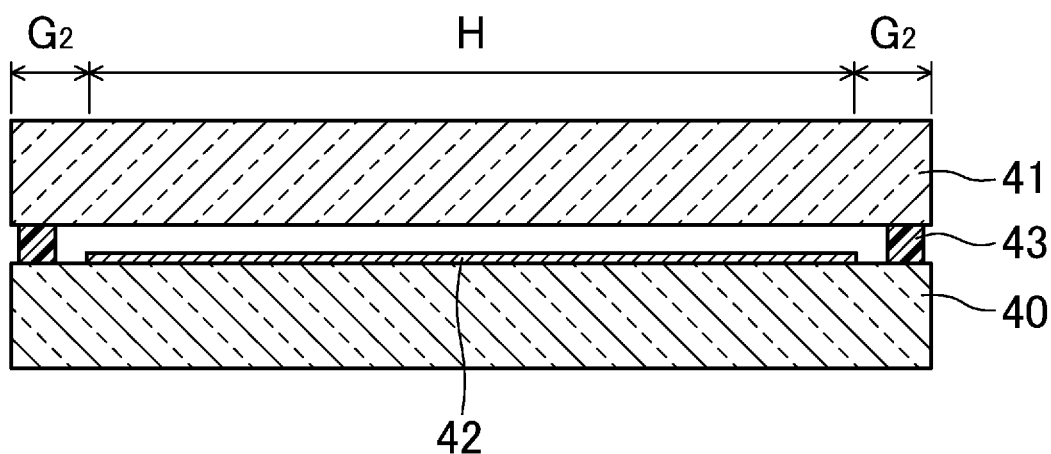
FIG. 32 is a cross-sectional view taken along the line J-J of FIG. 31.

For example, as shown in FIGS. 31 and 32, the present invention is also used for an organic EL display panel 61 including an element substrate 40, a sealing substrate 41, an organic EL display element 42, and a sealing material 43. The element substrate 40 is a first substrate. The sealing substrate 41 is a second substrate facing the element substrate 40. The organic EL display element 42 is formed on the element substrate 40 between the element substrate 40 and the sealing substrate 41. The sealing material 43 is provided between the element substrate 40 and the sealing substrate 41. The sealing material 43 bonds the element substrate 40 and the sealing substrate 41 together to enclose the organic EL display element 42.

The sealing material 43 is formed in a frame shape to surround the organic EL display element 42. The element substrate 40 and the sealing substrate 41 are bonded together via the sealing material 43.

As shown in FIGS. 31 and 32, the element substrate 40 has a display region H surrounded by the sealing material 43. The organic EL display element 42 is located in the display region H.

A four-sided frame region provided with the sealing material 43 is formed around the display region H. As shown in FIGS. 31 and 32, one side of the frame region is a wide frame region $G_1$ with a great width located close to a terminal region K. The other three sides are defined as a narrow frame region $G_2$ having a smaller width than the wide frame region $G_1$.

Similarly to the above-described liquid crystal display panel 1, a dummy structure 44 overlapping the sealing material 43 as viewed from above is provided in at least one of the element substrate 40 or the sealing substrate 41 in the wide frame region $G_1$ as shown in FIGS. 31 and 32. As a result, advantages similar to those of the above-described liquid crystal display panel 1 are provided.

In an organic EL display panel 62 shown in FIG. 33, similarly to the above-described liquid crystal display panel 50, a groove 45 (i.e., a through groove or a recessed groove) overlapping the sealing material 26 as viewed from above is provided in at least one of the element substrate 40 or the sealing substrate 41 in a narrow frame region $G_2$. As a result, advantages similar to those of the above-described liquid crystal display panel 50 are provided.

INDUSTRIAL APPLICABILITY

As described above, the present invention is suitable for display panels such as liquid crystal display panels formed by allowing a pair of substrates to overlap each other with a predetermined distance, and bonding the pair of substrates together via a sealing material.

DESCRIPTION OF REFERENCE CHARACTERS

1 Liquid Crystal Display Panel (Display Panel)
2 Dummy Structure
2a Linear Dummy Structure
2b Dot Dummy Structure
3 Through Groove
4 Dummy Structure
4a Linear Dummy Structure
5 Through Groove
10 TFT Substrate (First Substrate)
20 CF Substrate (Second Substrate)
22 Liquid Crystal Display Element (Display Element)
25 Liquid Crystal Layer
26 Sealing material
27 Pixel Electrode
28 Color Layer
29 Common Electrode
30 Bonded Structure
35 Spacer
40 Element Substrate (First Substrate)
41 Sealing Substrate (Second Substrate)
42 Organic EL display Element (Display Element)
43 Sealing material
44 Dummy Structure
45 Groove
50 Liquid Crystal Display Panel (Display Panel)
51 Insulating Substrate (First Insulating Substrate)
52 Planarization Film (First Planarization Film)
53 Insulating Substrate (Second Insulating Substrate)
54 Black Matrix
55 Color Layer
56 Color Filter
57 Planarization Film (Second Planarization Film)
58 Photo Spacer
61 Organic EL display Panel (Display Panel)
62 Organic EL display Panel (Display Panel)
65 Recessed Groove (Groove)
66 Through Groove (Groove)
67 Through Groove (Groove)
68 Insulating Film
69 Recessed Groove (Groove)
71 Step Member
72 Step Member
$F_1$ Wide Frame Region (First Frame Region)
$F_2$ Narrow Frame Region (Second Frame Region)
$G_1$ Wide Frame Region (First Frame Region)
$G_2$ Narrow Frame Region (Second Frame Region)
T Terminal Region

The invention claimed is:

1. A display panel comprising:
a first substrate;
a second substrate facing the first substrate;
a display element between the first substrate and the second substrate;
a terminal region along one side of the first substrate;
a display region including the display element and configured to display an image;
a frame region around the display region, the frame region including a first frame region adjacent to the terminal region, and a second frame region having a smaller width than the first frame region; and
a sealing material in the frame region between the first substrate and the second substrate, the sealing material configured to allow the first substrate to adhere to the second substrate; wherein a dummy structure overlapping the sealing material as viewed from above is provided in at least one of the first substrate or the second substrate in the first frame region;

the dummy structure is provided in the second substrate in the first frame region, and the second substrate includes a planarization film in the first frame region between the sealing material and the dummy structure, the planarization film covering the dummy structure;

the second substrate includes:
an insulating substrate; and
a black matrix on the insulating substrate; wherein a through groove is formed in the dummy structure;

the dummy structure is provided in the first frame region on a surface of the black matrix;

the planarization film covers the dummy structure and the black matrix; and the planarization film is in contact with the black matrix via the through groove.

2. The display panel of claim 1, wherein
the second substrate includes a color layer on the insulating substrate; and
the dummy structure is made of a same material as the color layer.

3. The display panel of claim 1, wherein
the sealing material includes a greater width in the first frame region than in the second frame region.

4. The display panel of claim 1, wherein
the display element is a liquid crystal display element.

5. The display panel of claim 1, wherein
the display element is an organic EL display element.

6. The display panel of claim 1, wherein
the terminal region is located along only one side of the frame region.

* * * * *